(12) United States Patent
Kashiwa

(10) Patent No.: US 7,898,835 B2
(45) Date of Patent: Mar. 1, 2011

(54) SEMICONDUCTOR MEMORY DEVICE AND METHOD FOR OPERATING SEMICONDUCTOR MEMORY DEVICE

(75) Inventor: Kotaro Kashiwa, Kanagawa (JP)

(73) Assignee: Sony Corporation, Tokyo (JP)

( * ) Notice: Subject to any disclaimer, the term of this patent is extended or adjusted under 35 U.S.C. 154(b) by 178 days.

(21) Appl. No.: 12/153,056

(22) Filed: May 13, 2008

(65) Prior Publication Data

US 2008/0316788 A1 Dec. 25, 2008

(30) Foreign Application Priority Data

Jun. 21, 2007 (JP) .............................. 2007-164195

(51) Int. Cl.
*G11C 5/02* (2006.01)
(52) U.S. Cl. .......................... 365/51; 365/63; 365/191; 365/233.1
(58) Field of Classification Search .................. 365/51, 365/63, 191, 233.1
See application file for complete search history.

(56) References Cited

U.S. PATENT DOCUMENTS

| | | | | |
|---|---|---|---|---|
| 6,867,992 | B2 * | 3/2005 | Tringali et al. ................. | 365/51 |
| 7,222,282 | B2 * | 5/2007 | Park ........................... | 714/741 |
| 7,353,329 | B2 * | 4/2008 | Ellis et al. .................... | 711/106 |
| 7,369,447 | B2 * | 5/2008 | Louie et al. ............. | 365/189.05 |
| 7,405,974 | B2 * | 7/2008 | Yaoi et al. ............... | 365/185.12 |
| 7,580,295 | B2 * | 8/2009 | Lee et al. ................ | 365/189.02 |
| 2005/0204091 | A1 * | 9/2005 | Kilbuck et al. .............. | 711/103 |
| 2008/0320215 | A1 * | 12/2008 | Kashiwa ..................... | 711/105 |
| 2009/0198858 | A1 * | 8/2009 | Ban et al. .................... | 710/307 |
| 2009/0238021 | A1 * | 9/2009 | Ban et al. .................... | 365/222 |

FOREIGN PATENT DOCUMENTS

| | | |
|---|---|---|
| JP | 05-120884 | 5/1993 |
| JP | 08-167703 | 6/1996 |
| JP | 11-213668 | 8/1999 |
| JP | 2002-074948 A | 3/2002 |
| JP | 2004-318500 | 11/2004 |
| JP | 2006-065533 | 3/2006 |
| JP | 2007-004967 A | 1/2007 |

OTHER PUBLICATIONS

Japanese Office Action issued Apr. 21, 2009 for corresponding Japanese Application No. 2007-164195.
Japanese Office Action issued Nov. 24, 2009 for corresponding Japanese Application No. 2007-164195.

* cited by examiner

*Primary Examiner*—Connie C Yoha
(74) *Attorney, Agent, or Firm*—Rader, Fishman & Grauer PLLC

(57) ABSTRACT

A semiconductor memory device includes a memory array section configured to serve as an information storage area and an interface section configured to interface between an external memory controller and the memory array section. The memory array section and the interface section are sealed in a package. The interface section has a plurality of interface modules corresponding to a plurality of memory types on a one-to-one basis. The method includes the steps of: selecting one of the plurality of interface modules in accordance with the memory type complying with specifications of the external memory controller being connected; and causing the selected interface module to access the memory array section for either a write or a read operation in response to either a write or a read request issued by the external memory controller.

14 Claims, 17 Drawing Sheets

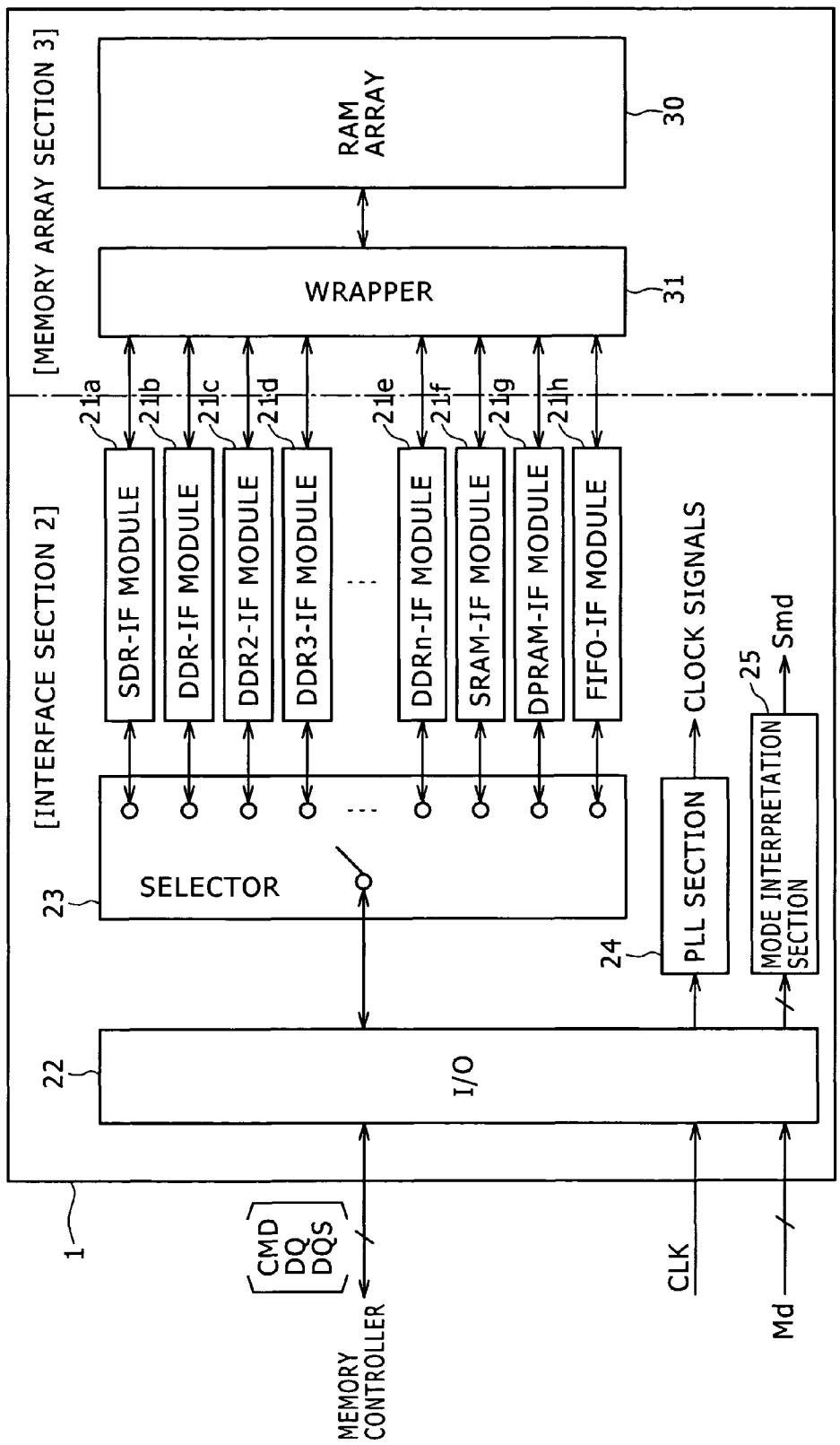
F I G. 2

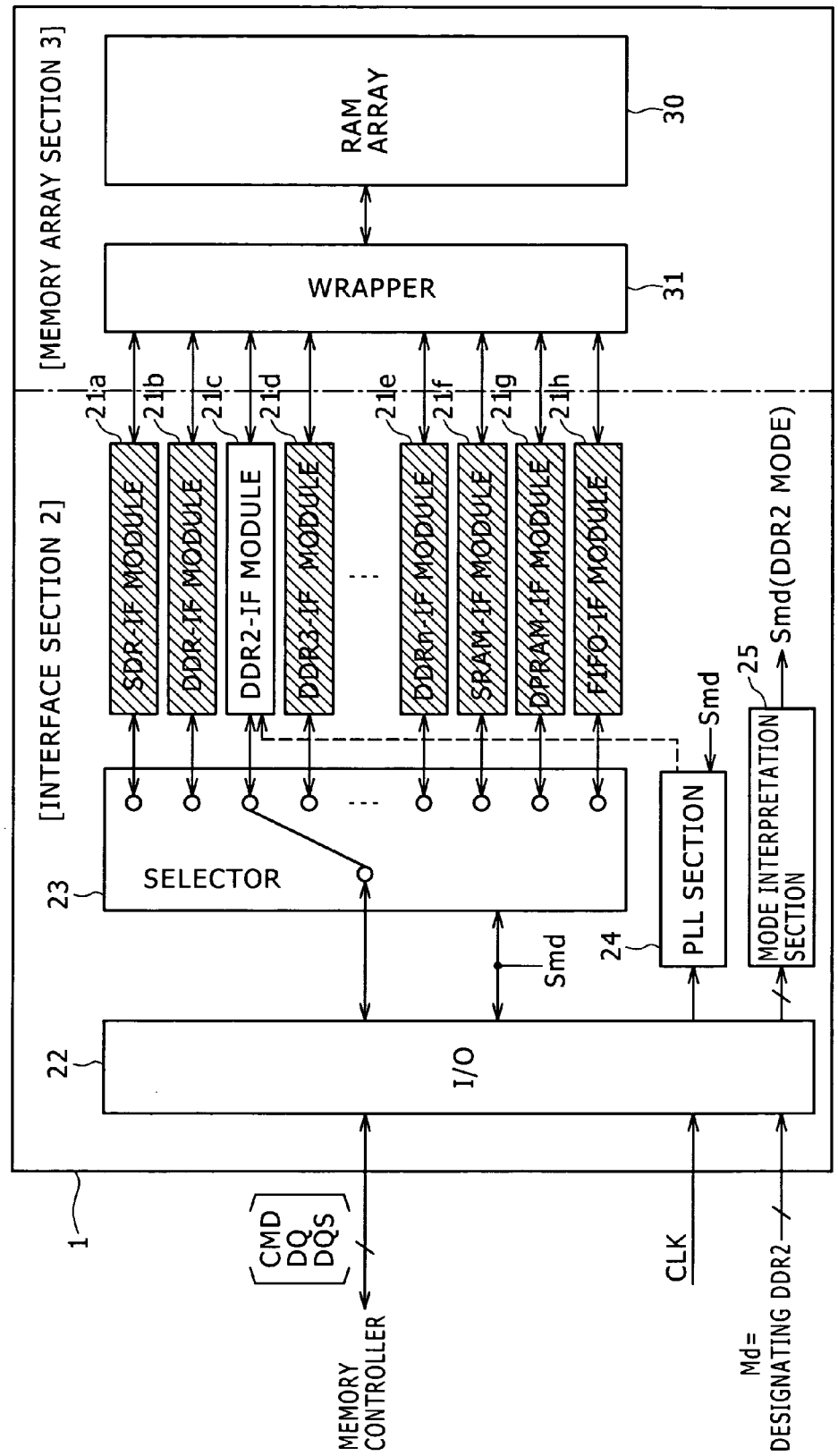

SDR
READ CYCLE TIMING     CL=2, BL=4

WRITE CYCLE TIMING     BL=4

CL : CAS LATENCY
BL : BURST LENGTH

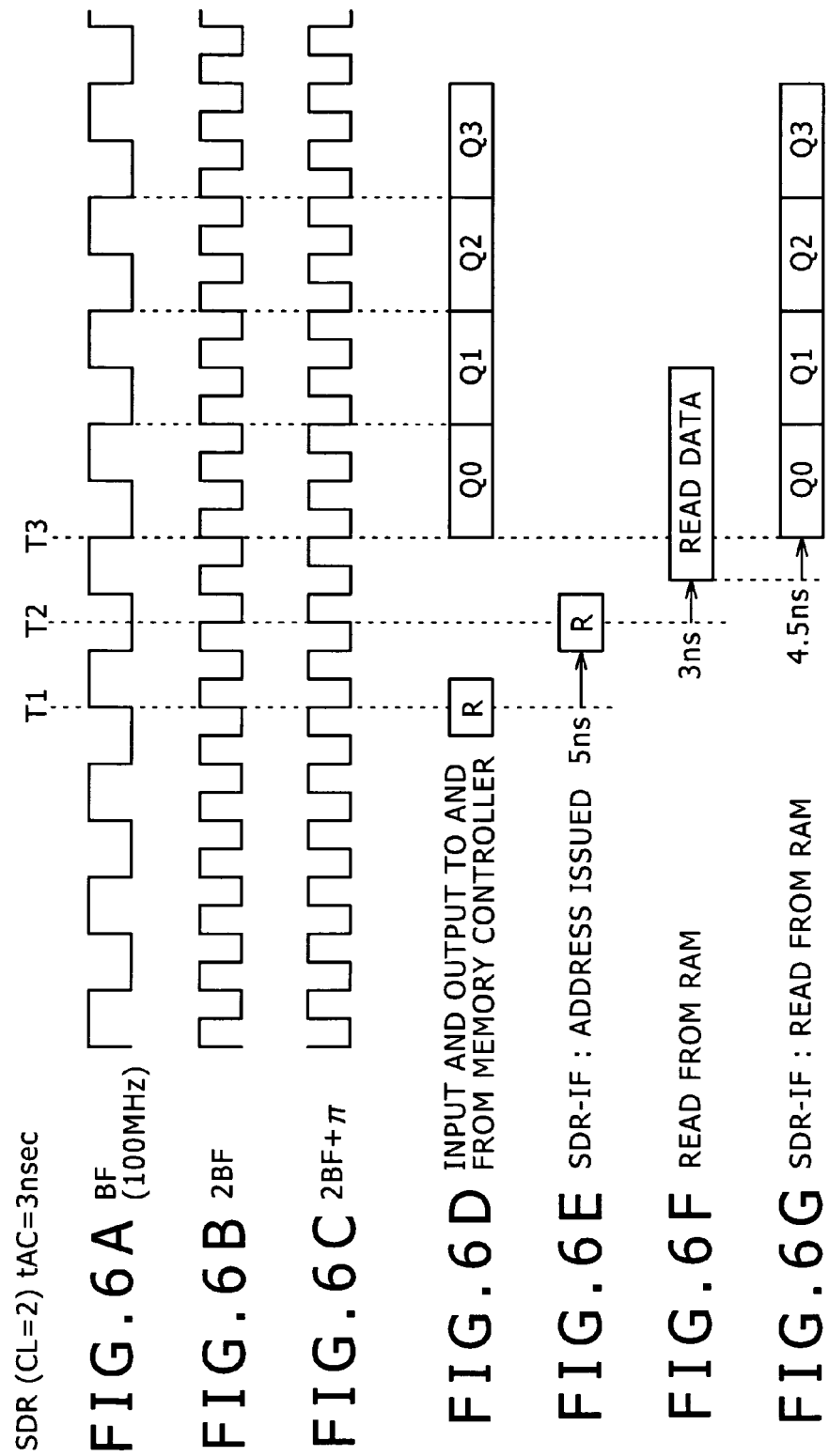

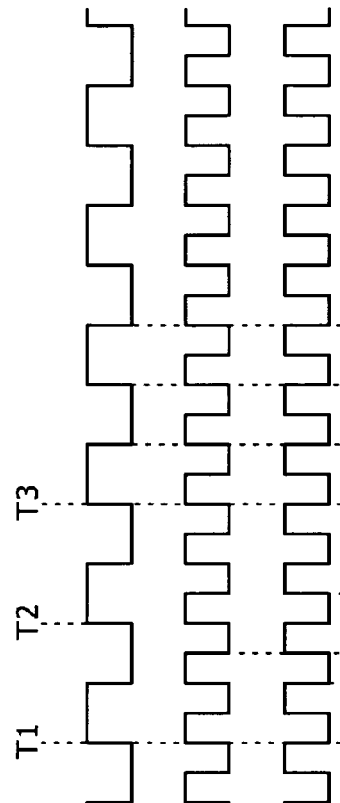
DDR (CL=2) tAC=3nsec
FIG. 7A BF (133MHz)
FIG. 7B 2BF
FIG. 7C 2BF+π
FIG. 7D INPUT AND OUTPUT TO AND FROM MEMORY CONTROLLER
FIG. 7E DDR-IF : INPUT
FIG. 7F DDR-IF : ADDRESS ISSUED
FIG. 7G READ FROM RAM
FIG. 7H DDR-IF : DATA EXPANDED
FIG. 7I DDR-IF : OUTPUT

SEMICONDUCTOR MEMORY DEVICE AND METHOD FOR OPERATING SEMICONDUCTOR MEMORY DEVICE

CROSS REFERENCES TO RELATED APPLICATIONS

The present invention contains subject matter related to Japanese Patent Application JP 2007-164195 filed with the Japanese Patent Office on Jun. 21, 2007, the entire contents of which are incorporated herein by reference.

BACKGROUND OF THE INVENTION

1. Field of the Invention

The present invention relates to a semiconductor memory device and a method for operating the semiconductor memory device.

2. Description of the Related Art

Japanese Patent Laid-open No. 2006-65533 and 2004-318500 are referenced in connection with the present invention.

Today, diverse types of semiconductor memory devices are offered for use as RAM chips in various electronic apparatuses. These memory devices vary in terms of circuit structure, operation and functionality. There are two major categories of RAM's from a circuit structure and operation point of view: DRAM (dynamic random access memory); and SRAM (static random access memory). As a variation of the DRAM, there is the SDRAM (synchronous dynamic random access memory) that outputs data in synchronism with an externally supplied clock signal. The SDRAM comes in such subtypes as SDR-SDRAM (single data rate SDRAM)), DDR-SDRAM (double data rate SDRAM), DDR2-SDRAM, DDR3-SDRAM, . . . DDR(n)-SDRAM.

From a structural point of view, there is a variation called the DPRAM (dual port RAM) that has a plurality of access ports. In functional terms, there is a variation known as the FIFO (first in first out) type RAM that has no need for addressing.

The above-outlined memory types are used selectively depending on what is needed by the host electronic apparatus. In the description that follows, the SDR-SDRAM will be referred to as the SDR, the DDR-SDRAM as the DDR, the DDR2-SDRAM as the DDR2, the DDR3-SDRAM through DDR(n)-SDRAM as the DDR3 through DDR(n), and the FIFO type as the FIFO for purposes of description.

SUMMARY OF THE INVENTION

The type of semiconductor memory device (semiconductor memory IC chip) incorporated in each electronic apparatus is determined in consideration of the necessary functions, performance, and cost factors. The memory controller for writing and reading data to and from a given type of semiconductor memory device is designed or selected obviously to perform memory access operations in a manner compatible with the memory type in question.

Depending on the circumstances, however, not all types of semiconductor memory devices are supplied stably on a constant basis. In recent years the types of semiconductor memory devices have rapidly diversified, and intense efforts to develop new types of memory are continuing. Meanwhile, production of the types of semiconductor memory devices for which demand has dropped is often discontinued by their manufacturers. Electronic apparatus manufacturers thus can be confronted with a serious problem if their products incorporate the type of semiconductor memory device for which production has ceased.

Suppose that an electronic apparatus manufacturer makes products incorporating the SDR and that the supply of the SDR has become unstable. In such a case, the apparatus manufacturer should consider adopting another semiconductor memory device replacing the SDR. If it is determined to adopt the DDR in place of the SDR, then the replacement of the SDR with the DDR does not happen by itself; it necessitates modifying the specifications of the memory controller for accessing the new semiconductor memory device. In some cases, the memory controller and peripheral circuits need to be redesigned altogether. The resulting losses in efficiency and hikes in cost can be considerable in the production stage.

In designing a new electronic apparatus, the apparatus manufacturer needs to ensure the supply of the necessary semiconductor memory device by predicting what kinds of semiconductor memory devices will be continuously available in the future. The prediction of memory device availability could force the electronic apparatus manufacturer to adopt a semiconductor memory device whose performance is unnecessarily high or to make a circuit design that will take into account possible future modifications in the specifications of the memory controller. Under these conditions, the degree of flexibility in providing an appropriate and efficient circuit design could be seriously hampered.

The present invention has been made in view of the above circumstances and provides among others a semiconductor memory device that can be used as a memory of diverse types.

In carrying out the present invention, and according to one embodiment thereof, there is provided a semiconductor memory device including a memory array section configured to serve as an information storage area and an interface section configured to interface between an external memory controller and the memory array section, the memory array section and the interface section being sealed in a package. The interface section has a plurality of interface modules corresponding to a plurality of memory types on a one-to-one basis.

Preferably, the memory array section and the interface section may be formed on a single silicon die when sealed in the package.

Preferably, the memory array section and the interface section may be formed on separate silicon dies and wired to each other when sealed in the package.

Preferably, one of the plurality of interface modules may correspond to one of the plurality of memory types including SDR, DDR, DDR2 through DDR(n), SRAM, DPRAM, and FIFO.

Preferably, the interface section may include an input/output buffer section configured to input and output signals to and from the external memory controller. The input/output buffer section may allow the external memory controller and the plurality of interface modules to exchange signals therebetween.

Preferably, the semiconductor memory device according to an embodiment of the present invention may further include a selector configured to select one of the plurality of interface modules which connects to the input/output buffer section. The input/output buffer section may allow the external memory controller and one of the plurality of interface modules selected by the selector to exchange signals therebetween.

Preferably, the semiconductor memory device according to an embodiment of the invention may further include a plurality of units of the input/output buffer section in a manner corresponding to the plurality of interface modules on a one-to-one basis. When connected to one of the units of the input/output buffer section, the external memory controller may exchange signals with the interface module corresponding to the connected unit of the input/output buffer section.

Preferably, the interface section may include a clock generation section configured to generate clock signals that are each used by each of the plurality of interface modules for processing.

Preferably, the interface section may include a mode interpretation section configured to interpret an input mode designation signal as indicative of a mode corresponding to one of the memory types. According to the memory type-specific mode interpreted by the mode interpretation section, one of the plurality of interface modules may access the memory array section for either a write or a read operation.

According to another embodiment of the present invention, there is provided a method for operating a semiconductor memory device including a memory array section configured to serve as an information storage area and an interface section configured to interface between an external memory controller and the memory array section, the memory array section and the interface section being sealed in a package, the interface section having a plurality of interface modules corresponding to a plurality of memory types on a one-to-one basis, the method including the steps of: selecting one of the plurality of interface modules in accordance with the memory type complying with specifications of the external memory controller being connected; and causing the selected interface module to access the memory array section for either a write or a read operation in response to either a write or a read request issued by the external memory controller.

As outlined above, the semiconductor memory device according to an embodiment of the present invention is a memory IC chip package that contains a memory array section structured illustratively as a DRAM or a SRAM, as well as a plurality of interface modules corresponding to diverse memory types such as SDR, DDR, DDR2, . . . DDR(n), SRAM, DPRAM, and FIFO.

Each of the interface modules writes and reads data to and from the memory array section in response to access requests from an external memory control circuit in keeping with the timings suitable for the corresponding memory type. For example, the SDR interface module inputs and outputs data to and from the memory array section in such a manner that the memory array section appears to function as a SDR memory array if viewed from the outside. Likewise, the DDR interface module writes and reads data to and from the memory array section in such a manner that the memory array section seems to function as a DDR memory array if looked at from the outside.

For example, the DRAM and SRAM are different from each other in terms of circuit structures, but one of them can be arranged to operate like the other memory type if the access timings are suitably adjusted. The same holds for the FIFO and the DPRAM. When each of the configured interface modules is operated appropriately, the memory array section can be arranged to operate as a SRAM or as a variation of the DRAM, such as a SDR or a DDR, whereas in fact the memory array section has the DRAM structure.

That is, the semiconductor memory device according to an embodiment of the present invention operates in such a manner that its memory type may vary depending on the interface module being active. It follows that the inventive semiconductor memory device can be arranged to function as a memory whose type varies with the specifications of an externally connected memory control circuit.

Through the use of the semiconductor memory device according to an embodiment of the present invention, it is possible to manufacture or design electronic apparatuses efficiently and to stabilize the production of such apparatuses. For example, if the manufacturer of an electronic apparatus incorporating the memory of a certain memory type is faced with an unstable supply of the memory type currently in use, the manufacturer can replace the presently adopted memory with the semiconductor memory device according to an embodiment of the present invention that can be arranged to operate in exactly the same manner as before. This makes it possible for the manufacturer to keep producing the electronic apparatus without altering the designs of the memory control circuit and peripheral circuits involved.

Where a new electronic apparatus is to be designed, the use of the inventive semiconductor memory device as the memory chip to be incorporated in the new apparatus promises higher degrees of flexibility and efficiency at the design stage than before. In addition, possible future modifications in the specifications of the memory can be addressed easily.

BRIEF DESCRIPTION OF THE DRAWINGS

These and other objects of the invention will be seen by reference to the description, taken in connection with the accompanying drawings, in which:

FIG. 2 is a block diagram of a semiconductor memory device practiced as one embodiment of the present invention;

FIG. 3 is an explanatory schematic view of how the semiconductor memory device of the embodiment operates;

FIGS. 6A through 6G are explanatory schematic views of the timings in effect when a SDR interface module of the embodiment is active;

FIGS. 7A through 7I are explanatory schematic views of the timings in effect when a DDR interface module of the embodiment is active;

DETAILED DESCRIPTION OF THE PREFERRED EMBODIMENTS

The description of how the present invention is typically embodied will be given under the following headings:

1. Outline of the semiconductor memory device;

2. Internal structures and operations of the semiconductor memory device;

3. Mode operations of the PLL section;

4. Mode operations of the selector;

5. Mode operations of the input/output buffer; and

6. Other embodiments of the semiconductor memory device

1. Outline of the Semiconductor Memory Device

Figure 1A:
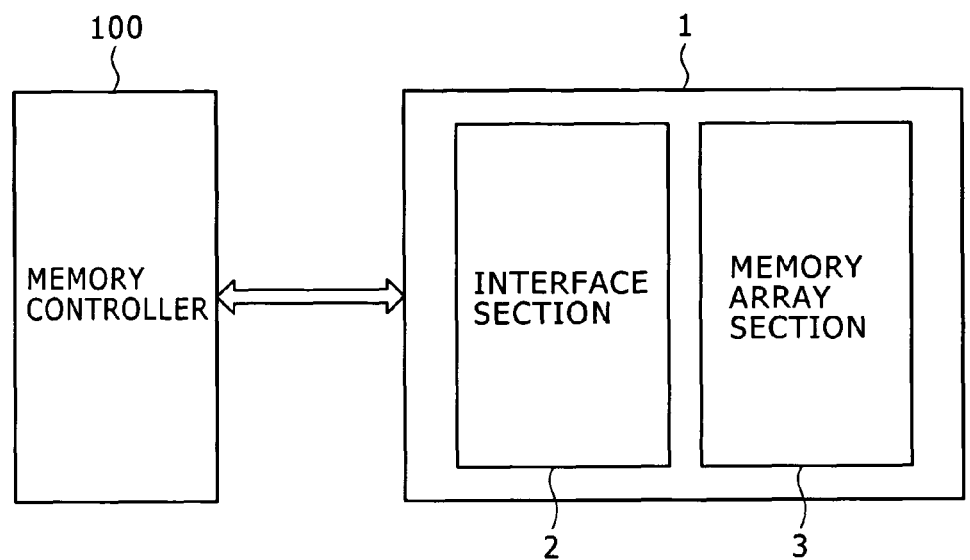
FIGS. 1A, 1B and 1C are explanatory schematic views of semiconductor memory devices according to an embodiment the present invention.

FIG. 1A shows an outline of a memory controller 100 and a semiconductor memory device 1 practiced as one embodiment of the present invention. The semiconductor memory device 1 is typically used as a memory IC in an electronic apparatus. The memory controller 100 incorporated in the electronic apparatus accesses the semiconductor memory device 1 for read and write operations.

Depending on its design specifications, the memory controller 100 handles the semiconductor memory device 1 as a particular type of memory. For example, if the memory controller 100 is designed to access the DDR, then the inventive semiconductor memory device 1 acts as a DDR when accessed by the memory controller 100 for data input and output. That is, once the semiconductor memory device 1 is mounted on a circuit arrangement of the host electronic apparatus and connected electrically to the memory controller 100, the semiconductor memory device 1 functions as the DDR thereafter.

It might happen that the memory controller 100 is designed to access the SDR in another electronic apparatus. In such a case, the semiconductor memory device 1 acts as a SDR when accessed by the memory controller 100 for data input and output. That is, once the semiconductor memory device 1 is mounted on a circuit arrangement of the electronic apparatus and connected electrically to the memory controller 100, the semiconductor memory device 1 functions as the SDR thereafter.

Even if the supplier of the SDR has stopped producing the product, the manufacturer of the electronic apparatus on which the SDR is mounted will have a choice to replace the current SDR with the semiconductor memory device 1 according to an embodiment of the present invention. The newly installed semiconductor memory device 1 will then be arranged to function as the SDR. The electronic apparatus manufacturer can continue manufacturing the apparatus without modifying the memory controller 100 or other components.

In the development stage of a new electronic apparatus, the use of the inventive semiconductor memory device 1 offers the apparatus manufacture an appreciably higher degree of flexibility than before in designing the memory controller 100 and peripheral circuits. The semiconductor memory device 1 according an embodiment of the present invention also allows the apparatus manufacturer to deal easily with a possible need for changing memory types in the future.

The semiconductor memory device 1 is formed as a monolithic memory IC in a single package. The device 1 contains an interface section 2 and a RAM array section 3 inside. The RAM array section 3 is formed either in the DRAM or in the SRAM structure. The interface section 2 has an input/output buffer connected to the memory controller 100 and a plurality of interface modules corresponding to diverse memory types. That is, the semiconductor memory device 1 of this embodiment is constituted by the interface section 2 having a plurality of interface modules corresponding to various memory types and by the RAM array section 3 formed as an information storage area, the two sections 2 and 3 being sealed in the package.

Figure 1B:
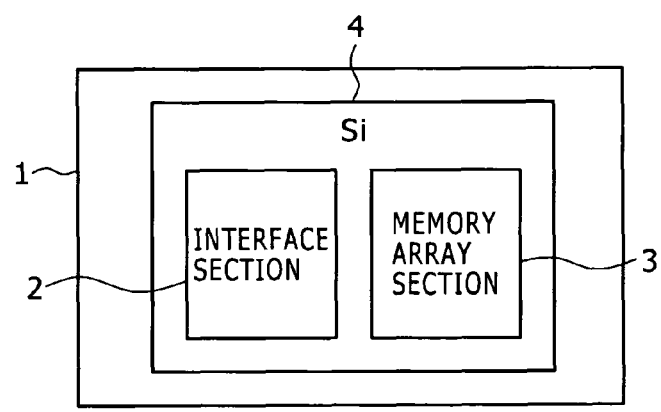
Figure 1C:
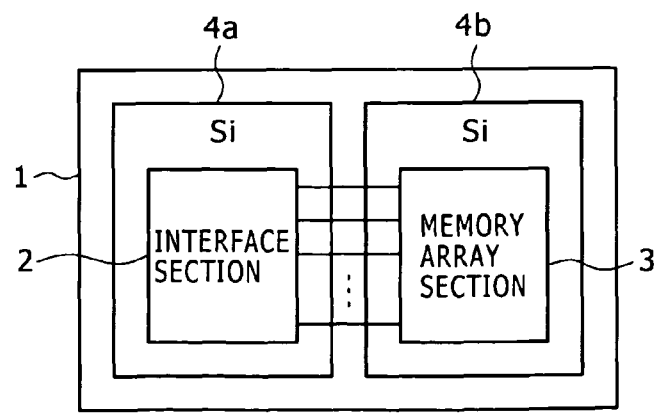

FIGS. 1B and 1C show possible semiconductor memory device structures inside the package. FIG. 1B shows an example in which the RAM array 3 and interface section 2 are formed on a single silicon die 4 and sealed in the package. FIG. 1C depicts an example in which the RAM array 3 and interface section 2 are formed on separate single silicon dies 4a and 4b when sealed in the package, the sections 2 and 3 being wired with each other.

2. Internal Structures and Operations of the Semiconductor Memory Device

FIG. 2 shows a typical circuit structure inside the semiconductor memory device 1. As described above, the semiconductor memory device 1 contains the interface section 2 and memory array section 3. The memory array section 3 includes a RAM array 30 and a wrapper 31. The interface section 2 includes a plurality of interface modules 21 (21a through 21h), an I/O buffer 22, a selector 23, a PLL section 24, and a mode interpretation section 25.

The RAM array 30 is formed illustratively as an information storage area in the DRAM or SRAM structure. The wrapper 31 permits conversion of control signals between the RAM array 30 and the interface modules 21 (21a through 21h). The RAM array 30 may have its cell structure designed flexibly as necessary. The wrapper 31 is intended to provide the signal conversion in keeping with the specifications of the RAM array 30, thereby implementing a general interface illustratively corresponding to the DRAM or SRAM.

In the interface section 2, the I/O buffer 22 electrically interfaces between the semiconductor memory device 1 and an external device (e.g., memory controller 100). For example, the I/O buffer 22 exchanges a command CMD, input/output data DQ, and a data strobe signal DQS. The I/O buffer 22 also inputs a system clock signal CLK, typically from the memory controller 100, and forwards the input clock signal to the PLL section 24.

Furthermore, the I/O buffer 22 inputs a mode designation signal Md and supplies the input signal to the mode interpretation section 25. The mode designation signal Md is a signal that designates the operation mode of the semiconductor memory device 1 (i.e., the type of the memory to be operated). Typically, the mode designation signal Md may be a logical value signal that is to be set by a small DIP switch formed on the package of the semiconductor memory device 1. Alternatively, a predetermined number of pins for mode setting may be formed on the package, and the pins may be connected in such a manner as to produce a logical value (e.g., a logical value by H/L/high impedance) that serves as the mode designation signal Md. As another alternative, the memory controller 100 may supply its mode designation signal Md to the semiconductor memory device 1.

The selector 23 selects one of the interface modules 21 (one of 21a through 21h) and allows the selected module to connect with the I/O buffer 22. The selection is based on a mode signal Smd issued by the mode interpretation section 25.

The interface modules 21 (21a through 21h) are provided to correspond with diverse memory types on a one-to-one basis. The example in FIG. 2 is shown furnished with a SDR-IF module 21a, a DDR-IF module 21b, a DDR2-IF module 21c, a DDR3-IF module 21d, . . . a DDR(n)-IF module 21e, a SRAM-IF module 21f, a DPRAM-IF module 21g, and a FIFO-IF module 21h.

Each of the interface modules 21a through 21f allows the semiconductor memory device 1 to function as the corresponding type of memory for data input and output in a suitably timed manner as requested by the memory controller 100. For example, the SDR-IF module 21a enables the RAM array 30 to function as the SDR in read and write operations when viewed from the externally connected memory controller 100. The DDR-IF module 21b allows the RAM array 30 to function as the DDR in read and write operations when viewed from the external memory controller 100.

In keeping with the system clock signal CLK supplied by the memory controller 100, the PLL section 24 generates various clock signals CK for use by the interface modules 21 (21a through 21h) in processing.

The mode interpretation section 25 interprets the logical value of the input mode designation signal Md to determine the mode in which the semiconductor memory device 1 is requested to function. The mode interpretation section 25 proceeds to supply the relevant components with a mode signal Smd indicative of the mode.

In the semiconductor memory device 1, the I/O buffer 22, the selector 23, the PLL section 24, and interface modules 21 operate in accordance with the mode signal Smd output by the mode interpretation section 25. These components combine to let the semiconductor memory device 1 function as a particular type of memory when viewed illustratively from the external memory controller 100.

Suppose that the memory controller 100 and the semiconductor memory device 1 of this embodiment are mounted on a circuit board of an electronic apparatus as illustrated in FIG. 1A. In such a case, the memory controller 100 performs memory control processes suitable for the DDR2. In this setup, the mode interpretation section 25 is fed with the mode designation signal Md indicative of the memory type DDR2. The mode designation signal Md is generated based on appropriate DIP switch settings or is provided as a signal by the memory controller 100.

How the mode designation signal Md is furnished is shown in FIG. 3. The mode interpretation section 25 outputs a mode signal Smd indicative of the DDR2 mode. The I/O buffer 22 changes internal electrical characteristics, such as supply voltage, and delay characteristics into those compatible with the DDR2 in accordance with the mode signal Smd, as will be discussed later.

Given the mode signal Smd, the selector 23 selects the DDR2-IF module 21c corresponding to the DDR2. On receiving the mode signal Smd, the PLL section 24 generates a group of clock signals that are to be supplied to the DDR2-IF module 21c; the supply of clock signals to the other interface modules (21a, 21b, 21d through 21h) is halted.

In that state, the semiconductor memory device 1 appears to function as the DDR2 when viewed from the memory controller 100. In order to control the DDR2, the memory controller 100 outputs the command CMD and handles the input/output data DQ and data strobe signal DQS in a manner timed to suit the DDR2. In such a case, the DDR2-IF module 21c writes or reads data to or from the RAM array 30 in response to the command CMD from the memory controller 100. From the viewpoint of the memory controller 100, the read and write operations are carried out in a manner timed to suit the DDR2. That means the memory controller 100 has no trouble in accessing the semiconductor memory device 1.

Each of the interface modules 21a through 21h is designed to let the memory controller 100 input and output data to and from the semiconductor memory device 1 in a manner timed to comply with the corresponding memory type. Below is a description of the workings of the SDR-IF module 21a and DDR-IF module 21b corresponding to the SDR and DDR respectively. The read and write timings of the SDR and DDR will be described first in reference to FIGS. 4A through 5B.

Figure 4A:
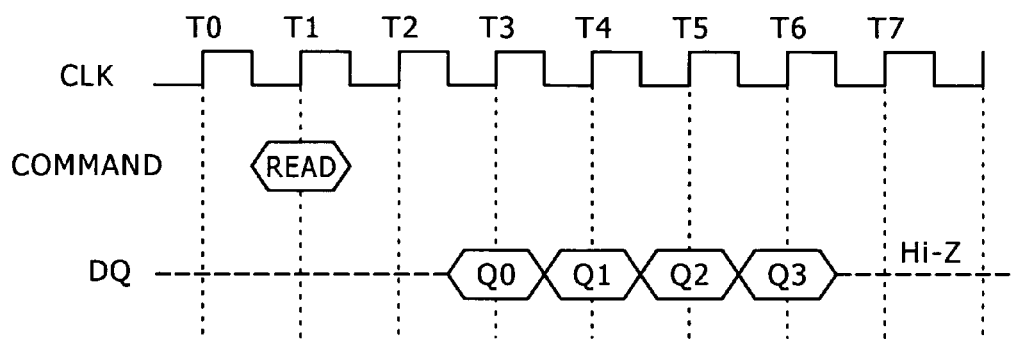
FIGS. 4A and 4B are explanatory timing charts of the read/write cycle timings of the SDR.
Figure 4B:
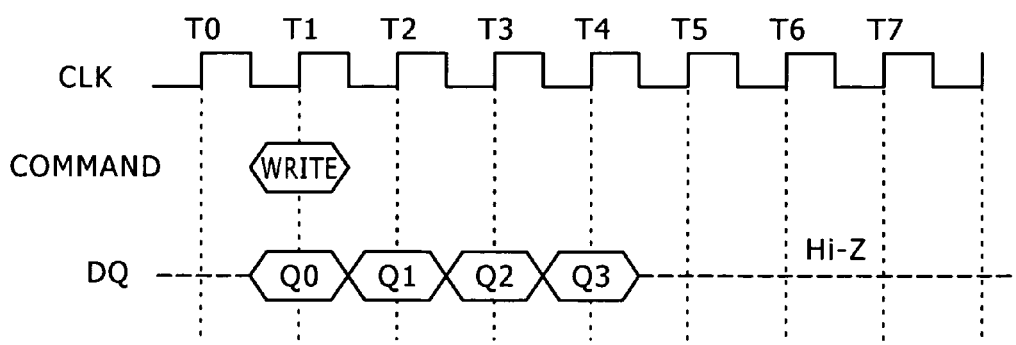

FIGS. 4A and 4B show typical read and write cycle timings of the SDR-SDRAM. In particular, these figures illustrate the timings of a system clock signal CLK, commands, and data input/output DQ in effect when the CAS latency (CL) is two and the burst length (BL) is four.

With the SDRAM, each control signal is latched at a leading edge of the input clock signal CLK. Data are input and output in synchronism with the clock CLK. The timings of the clock signal CLK at leading edges are represented by points in time T1, T2, etc.

In the read cycle timing of FIG. 4A, a read command supplied by the host (e.g., a memory control device such as the memory controller 100) is latched illustrative at time T1. When the CAS latency CL is 2, data items Q0, Q1, Q2 and Q3 are read out two clock cycles after the read command is latched and are output to the host.

In the write cycle timing of FIG. 4B, a write command supplied by the host is latched illustratively at time T1. The data items Q0, Q1, Q2 and Q3 given by the host are latched from time T1 on for write operations.

Figure 5A:
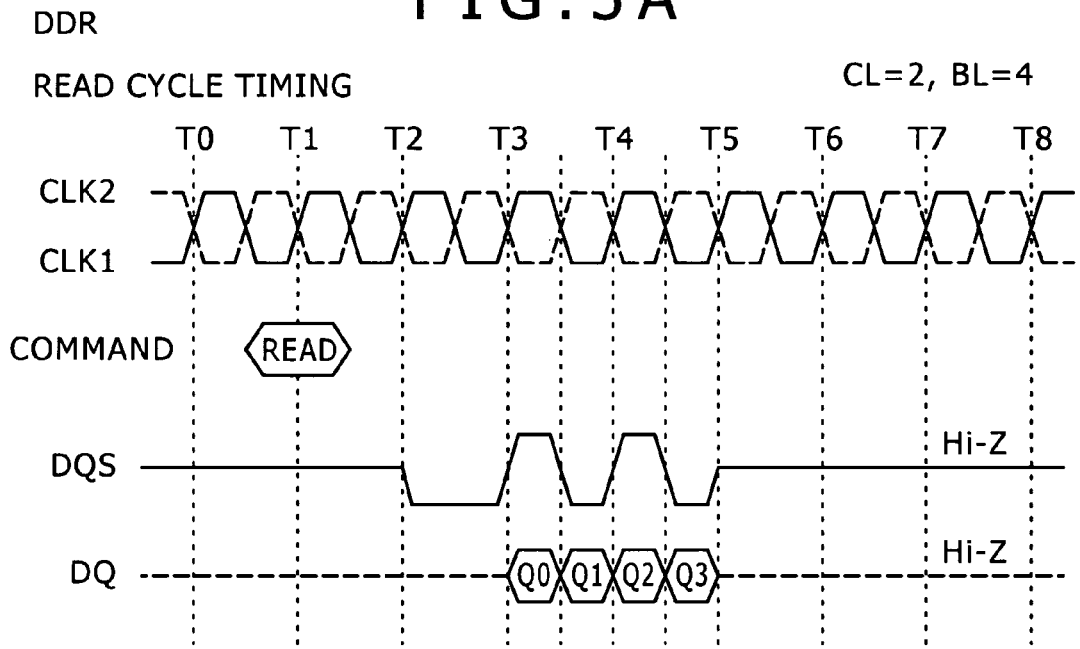
FIGS. 5A and 5B are explanatory timing charts of the read/write cycle timings of the DDR.
Figure 5B:
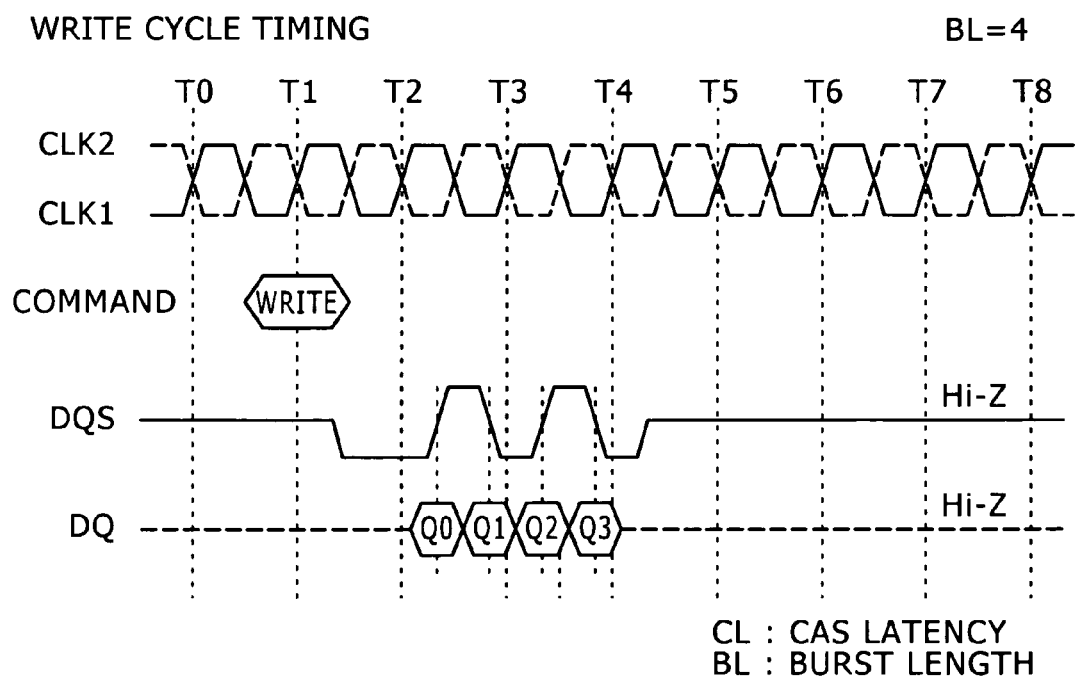

FIGS. 5A and 5B show typical read and write cycle timings of the DDR-SDRAM. These figures illustrate the timings of system clock signals CLK1 and CLK2, commands, data input/output DQ, and a data strobe signal DQS in effect when the CAS latency CL also is two and the burst length is four. The clock signal CLK2 is in a phase-inverted relation to the clock signal CLK1.

As with the SDR-SDRAM, the DDR-SDRAM has its commands input at leading edges of the input clock signal CLK. The data input/output timings of the DDR-SDRAM are different from those of the SDR-SDRAM.

In order to carry out high-speed data transfer, the DDR-SDRAM utilizes two clock signals CLK1 and CLK2 that are phase-inverted to each other, as well as the data strobe signal DQS. The data strobe signal DQS is synchronized with the clock signal CLK1 while the data input/output DQ is in synchronism with both leading and trailing edges of the data strobe signal DQS.

In the read cycle timing of FIG. 5A, the command is processed in synchronism with a leading edge of the clock signal CLK1 illustratively at time T1. When the CAS latency CL is two, data are output two clock cycles later at time T3. In this case, data items Q0, Q1, Q2 and Q3 are output in synchronism with both leading and trailing edges of the data strobe signal DQS.

In the write cycle timing of FIG. 5B, the write command supplied by the host is latched illustratively at time T1. The data items Q0, Q1, Q2 and Q3 are written in synchronism with both leading and trailing edges of the data strobe signal DQS.

The DDR2, DDR3, etc., operate basically in the same manner as the DDR. The differences between them may involve CAS latency and operation frequency settings that are selectable.

Such differences in process timings exist between the various memory types, such as the SDR and the DDR. The semiconductor memory device 1 of this embodiment tells these differences using the interface modules 21 in order to function as any one of these types of memories. FIGS. 6A through 6G and FIGS. 7A through 7I show typical input/output operation timings in effect when the SDR-IF module 21a or the DDR-IF module 21b is in operation.

FIGS. 6A through 7I illustrate timing examples in effect when the RAM array 30 has an access time tAC of 3 nsec between address input and data readout and is subject to the CAS latency CL of two.

FIGS. 6A through 6G show timing examples when the memory controller 100 regards the semiconductor memory device 1 as the SDR and issues a read request to the memory. That is, these timings apply when the semiconductor memory device 1 is placed in the SDR mode, with the SDR-IF module 21a in operation.

FIG. 6A indicates a basic clock signal BF occurring illustratively at a frequency of 100 MHz. This basic clock signal BF is in synchronism with, in phase with, and has the same frequency as the system clock signal CLK supplied by the memory controller 100 to the semiconductor memory device 1.

A clock signal 2BF shown in FIG. 6B has a frequency double that of the basic clock signal BF. A clock signal 2BF+π in FIG. 6C is in phase-inverted relation to the clock signal 2BF and is phase-shifted by 180 degrees with regard to the latter.

The above clock signals BF, 2BF and 2BF+π are generated by the PLL section 24 based on the input system clock signal CLK. These signals are supplied as a group of clock signals to the SDR-IF module 21a for processing.

FIG. 6D shows data input and output done by the SDR-IF module 21a to and from the memory controller 100 by way of the I/O buffer 22. FIG. 6E depicts the typical timing in which the SDR-IF module 21a issues an address to the RAM array 30 (wrapper 31). FIG. 6F indicates the typical timing in which the data read from the RAM array 30 is transferred to the SDR-IF module 21a. FIG. 6G illustrates the timing in which the SDR-IF module 21a expands the readout data and hands it over to the I/O buffer 22.

Suppose that a read command from the memory controller 100 is latched at time T1. In that case, the SDR-IF module 21a interprets the command and recognizes the readout address. Upon elapse of 5 nsec at time T2, the SDR-IF module 21a issues the address to the RAM array 30.

Since the RAM array 30 has the access time tAC of 3 nsec, the readout data is transferred to the SDR-IF module 21a 3 nsec later. Then the SDR-IF module 21a expands and outputs the readout data Q0, Q1, Q2 and Q3. Upon the elapse of 4.5 nsec and from time T3 on, the readout data items Q0, Q1, Q2 and Q3 start being expanded at leading edges of the basic clock signal BF. The expanded data items are output to the memory controller 100 via the I/O buffer 22.

In the manner described above, the readout operations comparable to those of the SDR-SDRAM having the CAS latency CL of two are carried out by the semiconductor memory device 1. In other words, the memory controller 100 just issues commands by regarding the semiconductor memory device 1 as the SDR. The semiconductor memory device 1 responds to the commands as a SDR subject to the required CAS latency of the SDR through the processing of the SDR-IF module 21a.

FIGS. 6A through 6G show the timing examples in effect when the RAM array 30 has the access time tAC of 3 nsec. If the access time tAC is longer, then the processing of the SDR-IF module 21a is accelerated accordingly. For example, if the access time tAC is 5 nsec and if the required CAS latency CL is two, then the SDR-IF module 21a starts expanding and outputting the readout data 2.5 nsec later. This makes it possible to output the readout data items Q0, Q1, Q2 and Q3 from time T3 on.

As another example, if the access time tAC is 8 nsec and the required CAS latency CL is two, then the SDR-IF module 21a issues an address to the RAM array 30 2.5 nsec after the read command is latched at time T1. The readout data transferred 8 nsec later is expanded and output from time T3 on, 2 nsec later.

FIGS. 7A through 7I show timing examples when the memory controller 100 regards the semiconductor memory device 1 as the DDR and issues a read request to the memory. That is, these timings apply when the semiconductor memory device 1 is placed in the DDR mode, with the DDR-IF module 21b in operation.

A basic clock signal BF indicated in FIG. 7A occurs illustratively at a frequency of 133 MHz and is in synchronism with, in phase with, and has the same frequency as the system clock signal CLK supplied by the memory controller 100 to the semiconductor memory device 1. A clock signal 2BF shown in FIG. 7B has a frequency double that of the basic clock signal BF. A clock signal 2BF+π in FIG. 7C is in phase-inverted relation to the clock signal 2BF and is phase-shifted by 180 degrees with regard to the latter.

The above clock signals BF, 2BF and 2BF+π are generated by the PLL section 24 based on the input system clock signal CLK. These signals are supplied as a group of clock signals to the DDR-IF module 21b for processing.

FIG. 7D shows data input and output done by the DDR-IF module 21b to and from the memory controller 100 by way of the I/O buffer 22. FIG. 7E depicts the typical address transaction timing applicable to the DDR-IF module 21b. FIG. 7E shows the typical timing in which the DDR-IF module 21b issues an address to the RAM array 30 (wrapper 31). FIG. 7G indicates the typical timing in which the data read from the RAM array 30 is transferred to the DDR-IF module 21b. FIG. 7H illustrates the timing in which the DDR-IF module 21b expands the readout data. FIG. 7I depicts the timing in which the DDR-IF module 21b hands the expanded readout data over to the I/O buffer 22.

Suppose that a read command from the memory controller 100 is latched at time T1. In such a case, the DDR-IF module 21b performs the address transaction during a time period of 3.76 nsec and issues the address to the RAM array 30.

Since the RAM array 30 has the access time tAC of 3 nsec, the readout data is transferred to the DDR-IF module 21b 3 nsec later. Then the DDR-IF module 21b expands the readout data Q0, Q1, Q2 and Q3 0.76 nsec later. Upon the elapse of 5.6 nsec and from time T3 on, the readout data items Q0, Q1, Q2 and Q3 are output to the memory controller 100 via the I/O buffer 22 at both leading and trailing edges of the basic clock signal BF.

In the manner described above, the readout operations comparable to those of the DDR-SDRAM having the CAS latency CL of two are carried out by the semiconductor memory device 1. In other words, the memory controller 100 just issues commands by regarding the semiconductor memory device 1 as the DDR. The semiconductor memory device 1 responds to the commands as a DDR subject to the required CAS latency of the SDR through the processing of the DDR-IF module 21b.

FIGS. 7A through 7I show the timing examples in effect when the RAM array 30 has the access time tAC of 3 nsec. If the access time tAC is longer, then the processing of the DDR-IF module 21b also may be accelerated accordingly.

The typical read operation timings in effect when the SDR-IF module 21a or the DDR-IF module 21b is in operation and described above. If any other interface module (e.g., DDR2-IF module 21c, etc.) than those discussed above is operated, then the semiconductor memory device 1 is just arranged to function as the corresponding type of memory.

Where the structure of FIG. 2 is in use, the semiconductor memory device 1 has one of its interface modules 21 set in operation, depending on the memory type-specific mode in effect. In that state, the semiconductor memory device 1 appears to function as one of the SDR, DDR, DDR2 through DDR(n), SRAM, DPRAM, and FIFO when viewed from the memory controller 100.

3. Mode Operations of the PLL Section

When operating as one of the different memory types, the semiconductor memory device 1 causes its own relevant components to perform processes that are in keeping with the mode signal Smd coming from the mode interpretation section 25, as discussed above. In particular, the PLL section 24, the selector 23, and the I/O buffer 22 operate in accordance with the mode signal Smd, in what may be called mode operations. The mode operations of these components will be discussed below.

Figure 8:
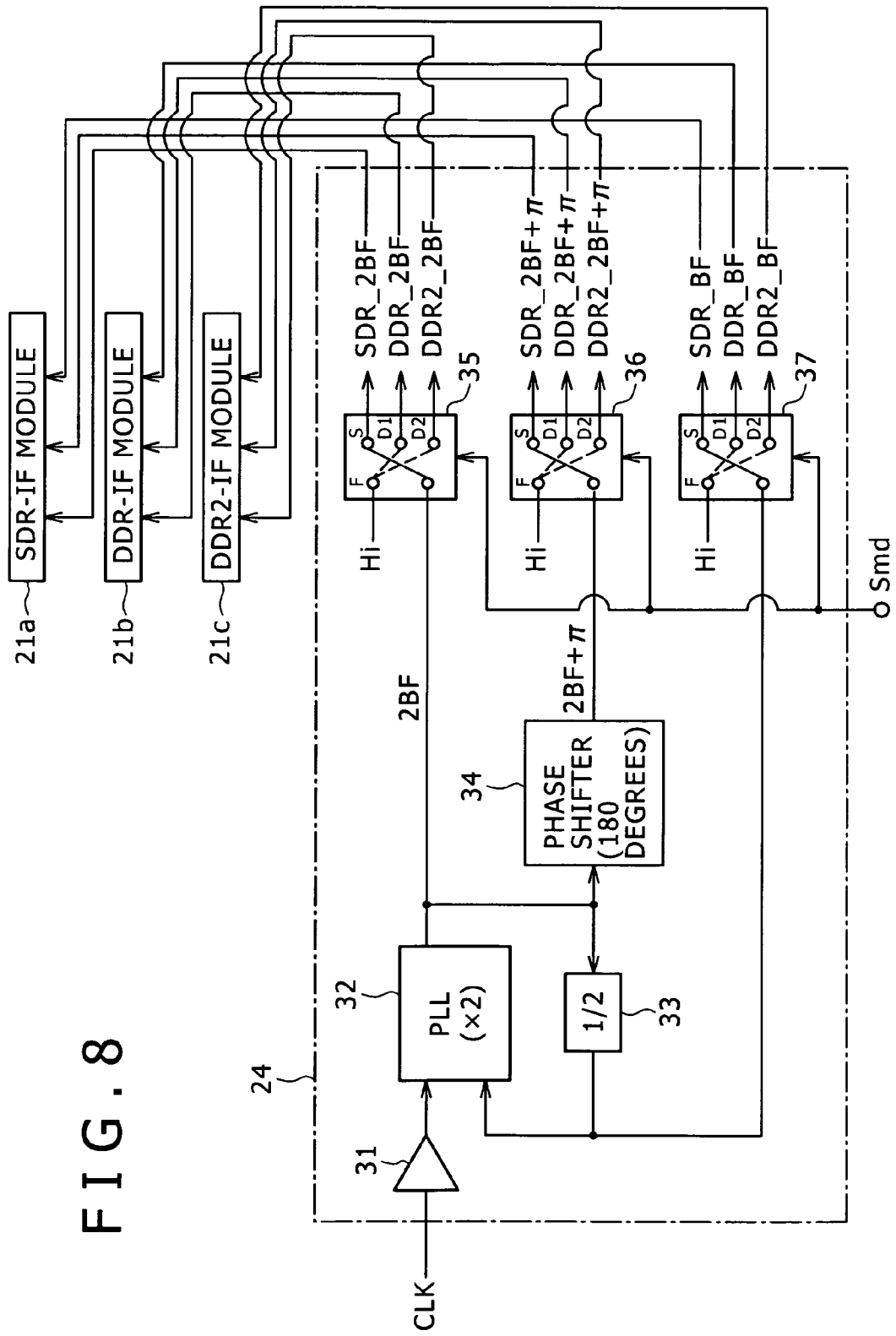
FIG. 8 is an explanatory schematic view of the mode operations in effect when a PLL section of the embodiment is active.

The mode operations of the PLL section 24 are described first. FIG. 8 depicts a typical internal structure of the PLL section 24. For purpose of simplification and illustration, the mode operations of the PLL section 24 will be discussed in reference to a clock output block with regard to three interface modules: SDR-IF module 21a; DDR-IF module 21b; and DDR2-IF module 21c.

The system clock signal CLK coming from the memory controller 100 is supplied to a clock generation PLL circuit 32 through a buffer amplifier 31. The clock generation PLL circuit 32 is formed typically as a PLL (phase locked loop) circuit that includes a phase comparator, a loop filter, a VCO (voltage controlled oscillator), and a clock doubler.

The clock generation PLL circuit 32 compares the system clock signal CLK with the output of a half-clock divider 33 in order to output a clock signal 2BF that is in synchronism with the system clock signal CLK and has a frequency double that of the latter. The clock signal 2BF is supplied to a changeover circuit 35.

The clock signal 2BF is divided by the half-clock divider 33 to have the same frequency as that of the system clock signal CLK. The clock signal 2BF divided by the half-clock divider 33 is fed back to the clock generation PLL circuit 32 as a phase comparison clock. The divided clock signal 2BF is sent further to a changeover circuit 37 as a basic clock signal BF in phase with the system clock signal CLK and having the same frequency as that of the latter.

Furthermore, the clock signal 2BF output by the clock generation PLL circuit 32 is phase-shifted by a phase shifter 34 to become a phase-inverted clock signal 2BF+π. This clock signal 2BF+π is forwarded to a changeover circuit 36.

The changeover circuits 35, 36 and 37 each have terminals S, D1, and D2. The terminal S is connected to the SDR-IF module 21a, the terminal D1 is connected to the DDR-IF module 21b, and the terminal D2 is connected to the DDR2-IF module 21c.

The changeover circuits 35, 36 and 37 are each furnished with a fixed voltage terminal F that is fed with a High-level voltage Hi. The fixed voltage terminal F may be alternatively fed with a Low-level voltage. As another alternative, the fixed voltage terminal F may be placed in a high-impedance state.

Because in FIG. 8 the clock output block is shown with regard to the three interface modules (21a, 21b, and 21c) as mentioned above, the changeover circuits 35, 36 and 37 are each furnished with three output terminals. In practice, each of the changeover circuits 35, 36 and 37 is provided further with output terminals corresponding to the other interface modules (21d through 21h). Each of these terminals is arranged to be selectable.

The mode signal Smd fed from the mode interpretation section 25 to the PLL section 24 is sent to the changeover circuits 35, 36 and 37. In response to the mode signal Smd, the changeover circuits 35, 36 and 37 change their connection settings accordingly.

For example, if the mode signal Smd designates the SDR mode, then the changeover circuits 35, 36 and 37 each select the terminal S as the output terminal. The output terminals not selected for the mode of interest (i.e., terminals D1, D2 and other output terminals, not shown) are connected to the fixed voltage terminal F.

In the above state, as illustrated in FIG. 8, the clock signals 2BF, 2BF+π, and BF are sent from each terminal S to the SDR-IF module 21a as a group of clock signals for processing. For example, if the system clock signal CLK having the frequency of 100 MHz comes from the memory controller 100, then the SDR-IF module 21a is fed with the 100 MHz basic clock signal BF, the double-frequency clock signal 2BF, and the phase-inverted double-frequency clock signal 2BF+π shown in FIGS. 6A through 6C.

Given the group of clock signals for processing, the SDR-IF module 21a starts to function. Meanwhile, the DDR-IF module 21b and the DDR2-IF module 21c (as well as the other interface modules 21d through 21h, not shown) are deprived of their clock signals for processing and thus are switched off.

If the mode signal Smd designates the DDR mode, then the changeover circuits 35, 36 and 37 each select the terminal D1 as the output terminal and have the other output terminals (i.e., terminals S, D2 and other output terminals, not shown) connected to the fixed voltage terminal F. These connection settings allow each terminal D1 to supply the clock signals 2BF, 2BF+π and BF to the DDR-IF module 21b as a group of clock signals for processing. For example, if the system block signal having the frequency of 133 MHz comes from the memory controller 100, then the DDR-IF module 21b is fed with the 133 MHz basic clock signal BF, the double-frequency clock signal 2BF, and the phase-inverted double-frequency clock signal 2BF+π shown in FIGS. 7A through 7C.

Upon receipt of the group of clock signals for processing, the DDR-IF module 21b starts to function. Meanwhile, the SDR-IF module 21a and the DDR2-IF module 21c (as well as the other interface modules 21d through 21h, not shown) are deprived of their clock signals for processing and thus are turned off.

As described, the PLL section 24 supplies the interface modules 21a through 21h with the clock signals corresponding to the mode signal Smd. The mode signal Smd enables one applicable interface module to start functioning and turns off the other interface modules.

4. Mode Operations of the Selector

Figure 9:
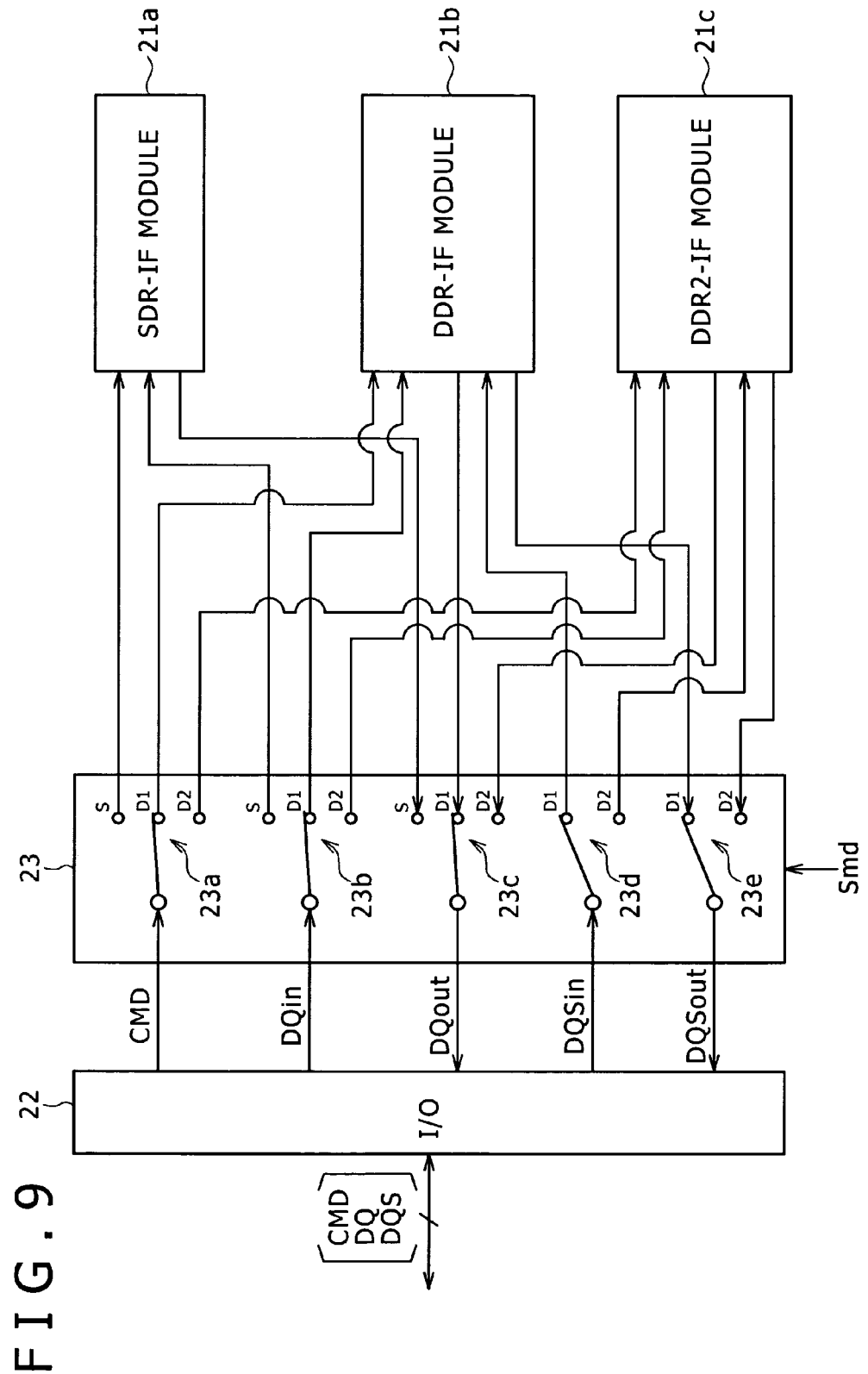
FIG. 9 is an explanatory schematic view of the mode operations in effect when a selector of the embodiment is active.

The mode operations of the selector 23 now will be described with reference to FIG. 9. In FIG. 9, as in FIG. 8, three interface modules, the SDR-IF module 21a, the DDR-IF module 21b and the DDR2-IF module 21c, and their related circuitry are indicated.

As mentioned above, the command CMD, the input/output data DQ, and the data strobe signal DQS are exchanged between the memory controller 100 and the I/O buffer 22. Through the selector 23, these signals are transferred in the form of a command CMD, a data input DQin, a data output DQout, a strobe signal input DQSin, and a strobe signal output DQSout.

More specifically, the selector 23 transfers to the interface module 21 the command CMD input by the memory controller 100 to the I/O buffer 22. If the command CMD is a write command, then the memory controller 100 inputs write data to the I/O buffer 22. From the I/O buffer 22, the selector 23 transfers the write data to the interface module 21 as the data input DQin.

If the command CMD is a read command, then the memory controller 100 reads data from the RAM array 30. The selector 23 transfers the readout data to the I/O buffer 22 as the data output DQout.

If the mode is one of DDR through DDR(n), then the data strobe signal DQS is used. The selector 23 inputs and outputs the data strobe signal DQS in the form of two signals: the strobe signal input DQSin; and the strobe signal output DQSout.

The selector 23 has selection switch circuits 23a through 23e furnished so as to correspond with the above-mentioned signals. A selection switch circuit 23a corresponds to the command CMD and has output terminals S, D1 and D2 corresponding to the interface modules 21. A selection switch circuit 23b corresponds to the data input DQin and has output terminals S, D1 and D2 corresponding to the interface modules 21.

A selection switch circuit 23c corresponds to the data output DQout and has input terminals S, D1 and D2 corresponding to the interface modules 21. A selection switch circuit 23d corresponds to the strobe signal input DQSin and has output terminals D1 and D2 corresponding to the interface modules 21. A selection switch circuit 23e corresponds to the strobe signal output DQSout and has input terminals D1 and D2 corresponding to the interface modules 21.

FIG. 9 depicts an input/output block with regard to three interface modules (21a, 21b, and 21c), so that the selection switch circuits 23a through 23e are not shown to have input or output terminals corresponding to the other interface modules (21d through 21h). In practice, however, each of the selection switch circuits 23a through 23e is provided further with such input or output terminals with regard to the other interface modules (21d through 21h). Each of these terminals is arranged to be selectable.

The selection switch circuits 23a through 23e in the selector 23 each select the output or input terminal corresponding to the mode signal Smd coming from the mode interpretation section 25. For example, if the mode signal Smd designates the SDR mode, then the selection switch circuits 23a, 23b and 23c each select the terminal S. Since the SDR has no use for the data strobe signal DQS, the selection switch circuits 23d and 23e may be left disconnected. These connection settings permit the transfer of the command CMD, the data input DQin, and the data output DQout between the I/O buffer 22 and the SDR-IF module 21a.

If the mode signal Smd designates the DDR mode, then the selection switch circuits 23a through 23e each select the terminal D1. In this state, as illustrated in FIG. 9, the command CMD, the data input DQin, the data output DQout, the strobe signal input DQSin, and the strobe signal output DQSout are transferred between the I/O buffer 22 and the DDR-IF module 21b.

As described, the selector 23 has its selection switch circuits 23a through 23e setting the selective connections reflecting the mode signal Smd in effect. The connections permit the transfer of signals between the single active interface module and the I/O buffer 22 and enable signal input and output between the currently functioning interface module and the memory controller 100.

5. Mode Operations of the Input/Output Buffer

The mode operations of the I/O buffer 22 involve changing internal electrical characteristics, such as buffer supply voltage, and delay characteristics into those compatible with the mode of interest (i.e., the memory type to be implemented). The buffer supply voltage varies with the memory type; it is typically 3.3 V or 2.5 V for the SDR, 2.5 V for the DDR, 1.8 V for the DDR2, and 1.5 V for the DDR3. Thus, the I/O buffer 22 of the inventive semiconductor memory device 1 requires changing the supply voltage depending on the mode in effect.

FIGS. 10 through 14 show typical structures of the I/O buffer 22 for changing the supply voltage and delay characteristics. In each of these figures, a changeover is shown to be made between two types of buffers, type A and type B, in terms of the supply voltage. For example, the buffer amplifier indicated by reference character A in each figure is a type A buffer that operates at the supply voltage of 3.3 V and has a delay characteristic of $\tau 1$; the buffer amplifier designated by reference character B is a type B buffer that operates at the supply voltage of 2.5 V and has a delay characteristic of $\tau 2$.

What follows is an explanation of changing the electrical characteristics of the type A and type B buffers. In practice, obviously, the buffers may be structured to address the number and the types of memories to be dealt with by the semiconductor memory device 1.

In each of FIGS. 10 through 14, signal paths are shown implemented in three streams: an input stream; an output stream; and a bidirectional stream. In practice, one of these three streams is considered to cover the actual signal paths. For example, the signal paths for the command CMD and the data input DQin are covered by the input stream in each figure.

It should be noted that in each of FIGS. 10 through 14, an internal logic 30 represents a block that embraces the selector 23, the PLL section 24, and the interface modules 21 (21a through 21h).

Figure 10:
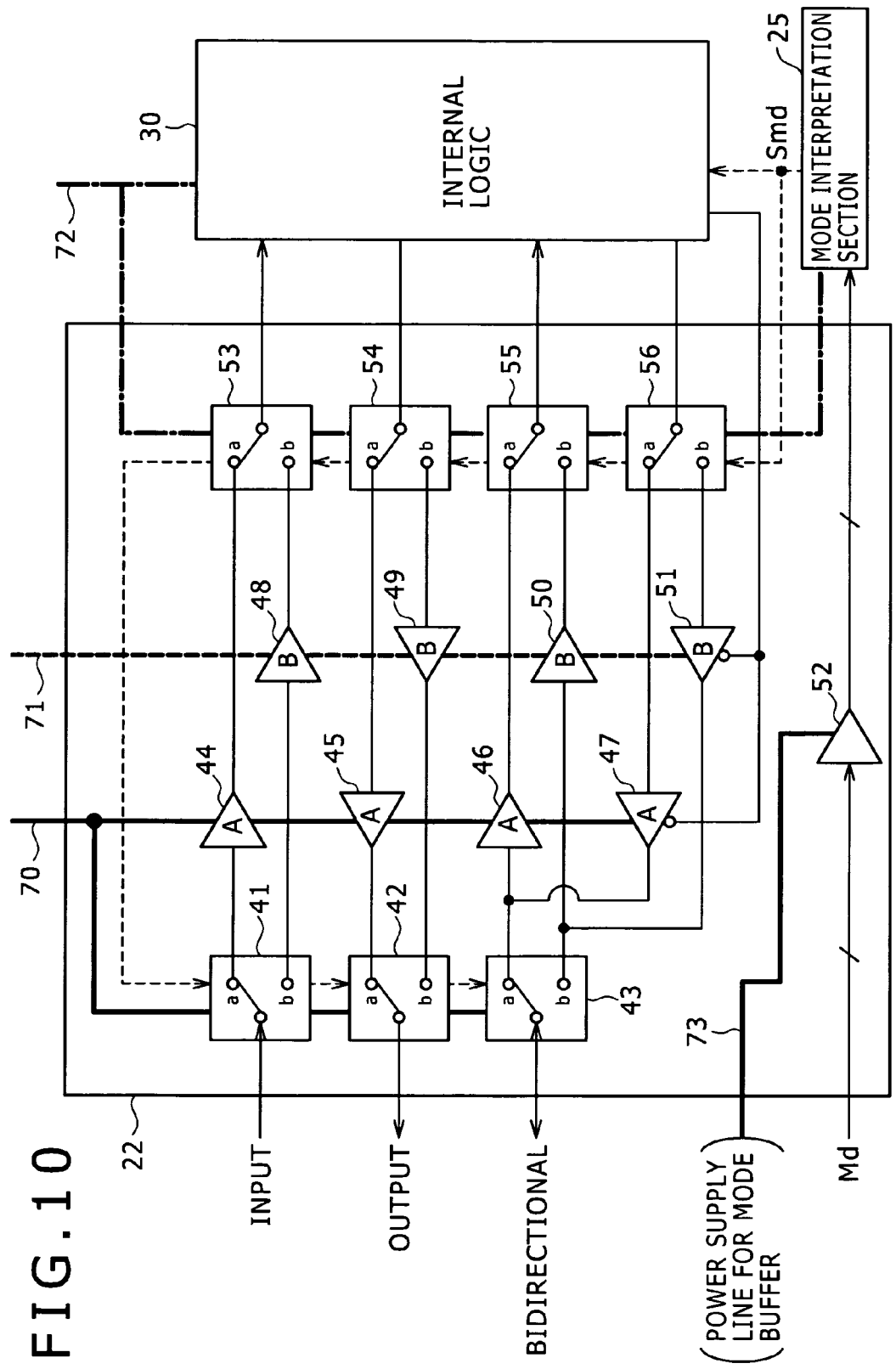
FIG. 10 is an explanatory schematic view of the mode operations in effect when an input/output buffer of the embodiment is active.

The example of FIG. 10 will now be described below. The input stream of the I/O buffer 22 includes a type A buffer 44, a type B buffer 48, and switches 41 and 53. The output stream of the I/O buffer 22 includes a type A buffer 45, a type B buffer 49, and switches 42 and 54. The bidirectional stream of the I/O buffer 22 includes a type A buffer 46, a type A tri-state buffer 47, a type B buffer 50, a type B tri-state buffer 51, and switches 43, 55 and 56. The mode designation signal Md is sent to the mode interpretation section 25 via a buffer amplifier 52.

The power supply lines introduced into the semiconductor memory device 1 from the outside are made up of a type A buffer power supply line 70, a type B buffer power supply line 71, an internal logic power supply line 72, and a mode buffer power supply line 73.

The type A buffer power supply line 70 is illustratively a 3.3 V supply line that powers the type A buffers 44, 45 and 46, the type A tri-state buffer 47, and the switches 41, 42 and 43.

The type B buffer power supply line 71 is typically a 2.5 V supply line that powers the type B buffers 48, 49 and 50 and the type B tri-state buffer 51.

The internal logic power supply line 72 furnishes the supply voltage to the circuits in the internal logic 30 (i.e., interface modules 21 and the PLL section 24) and the mode interpretation section 25 for operation purposes. The power supply line 72 further provides the supply voltage to the switches 53, 54, 55 and 56 for switching operations.

Meanwhile, the mode buffer power supply line 73 feeds the supply voltage to the buffer amplifier 52 for operation purposes.

In the above example, the switches 41, 42 and 43 are shown to be fed with the supply voltage from the type A buffer power supply line 70. However, this does not limit the present invention. The switches 41, 42 and 43 are just provided with a supply voltage that enables then to perform their switching operations. That is, the switches 41, 42 and 43 may be fed alternatively with the supply voltage from some other power supply line.

The switches 41, 42, 43, 53, 54, 55 and 56 are each structured to switch between a terminal "a" corresponding to the type A on the one hand and a terminal "b" corresponding to the type B on the other hand. Given the mode switch Smd from the mode interpretation section 25, the switches 41, 42, 43, 53, 54, 55 and 56 each switch between the terminals "a" and "b".

For example, if the mode signal Smd designates the memory type corresponding to the type A, then the switches 41, 42, 43, 53, 54, 55 and 56 each select the terminal "a". The selected switch settings enable the type A buffers 44, 45 and 46, as well as the type A tri-state buffer 47 to function in the I/O buffer 22 for the input and output of diverse signals. In other words, the I/O buffer operations representative of the memory type corresponding to the type A are executed.

If the mode signal Smd designates the memory type corresponding to the type B, then the switches 41, 42, 43, 53, 54, 55 and 56 each select the terminal "b". The selected switch settings enable the type B buffers 48, 49 and 50, as well as the type B tri-state buffer 51, to function in the I/O buffer 22 for the input and output of various signals. That is, the I/O buffer operations representative of the memory type corresponding to the type B are carried out.

In the foregoing example, two types of electrical characteristics are discussed as the type A and type B. In practice, a switchover may have to be carried out between many more types of buffers in terms of electrical characteristics, depending on the number and the types of the interface modules 21 to be configured.

For example, the buffers of numerous types (type C, type D, etc.) in terms of supply voltage and delay characteristics may be needed. In such cases, these buffers may be accommodated by suitably setting the switches 41, 42, 43, 53, 54, 55 and 56 with the same buffer amplifiers as those of the type A and type B also incorporated above.

In the ensuing description of other structures of the I/O buffer with reference to FIGS. 11 through 14, each buffer structure should be construed thusly as also representative of an extended version accommodating many more types of electrical characteristics.

Another typical structure of the I/O buffer 22 will be described thusly by referring to FIG. 11. Of the reference numerals shown in FIG. 11, those already used in FIG. 10 designate like corresponding parts, and their descriptions will be omitted where redundant.

Figure 11:
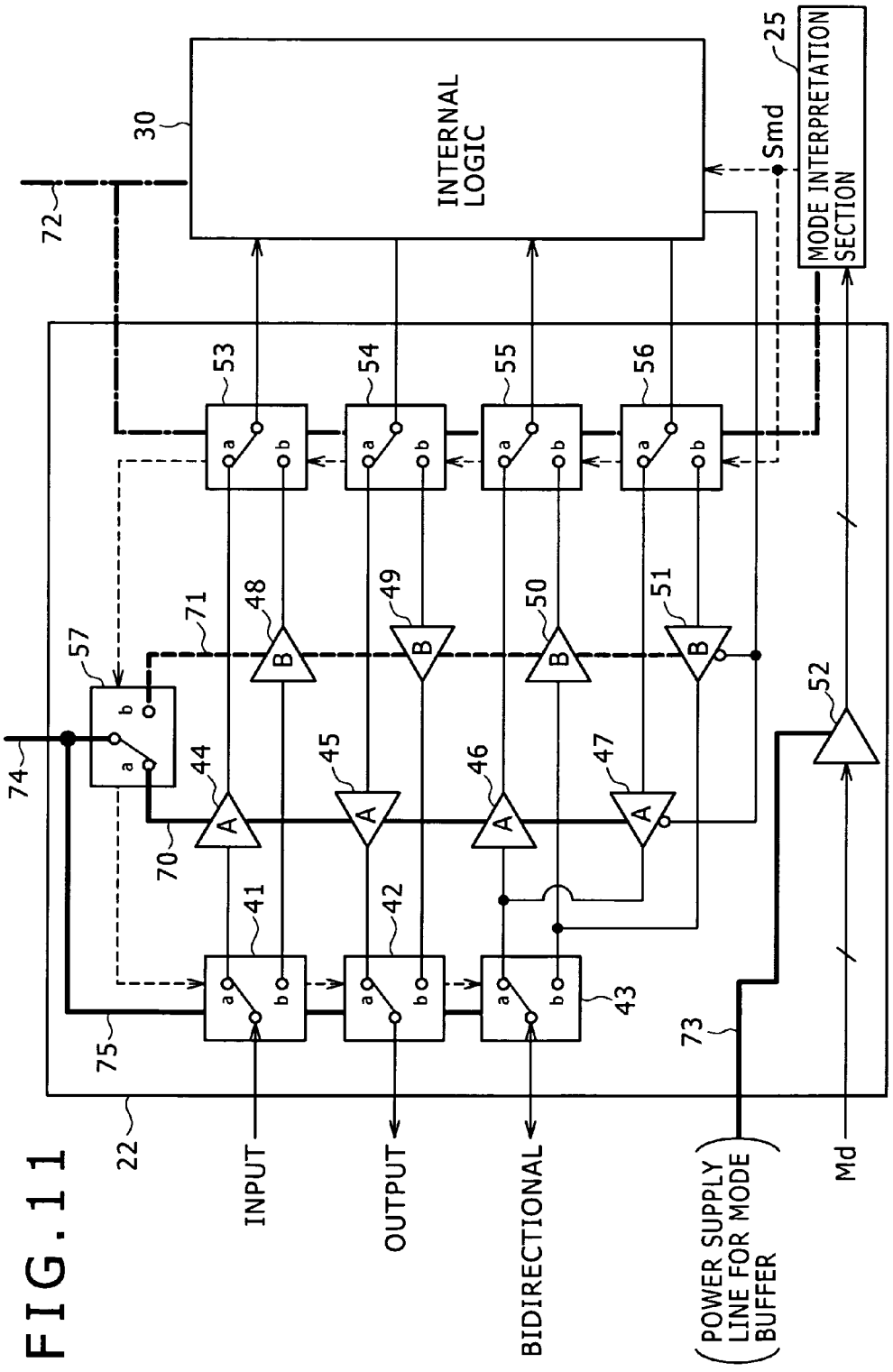
FIG. 11 is another explanatory schematic view of the mode operations in effect when the input/output buffer of the embodiment is active.

The structure of FIG. 11 has three power supply lines introduced into the semiconductor memory device 1 from the outside. These lines are a buffer power supply line 74, a mode buffer power supply line 73, and an internal logic power supply line 72.

The buffer power supply line 74 powers switches 41, 42 and 43. A power supply line switch 57 changes the connection between the type A and the type B. The mode signal Smd is fed to the switches 41, 42, 43, 53, 54, 55 and 56, as well as to the power supply line switch 57.

The buffer power supply line 74 is fed with a predetermined supply voltage, depending on the type of memory that the semiconductor memory device 1 is arranged to constitute when mounted on a circuit board of the host electronic apparatus. For example, if the electronic apparatus utilizes the semiconductor memory device 1 as the SDR, then the buffer power supply line 74 is connected fixedly to a 3.3 V power supply line through circuit board wiring. If the electronic apparatus employs the semiconductor memory device 1 as the DDR, then the buffer power supply line 74 is connected fixedly to a 2.5 V power supply line through circuit board wiring.

If the mode signal Smd designates the memory type corresponding to the type A, then the switches 41, 42, 43, 53, 54, 55 and 56 each select the terminal "a" and so does the power supply switch 57. In this case, the buffer power supply line 74 serves as the 3.3 V power supply line, supplying the voltage of 3.3 V to the type A buffers 44, 45 and 46, as well as to the type A tri-state buffer 47. In the I/O buffer 22, the type A buffers 44, 45 and 46 and the type A tri-state buffer 47 then operate to input and output various signals, thereby implementing the input/output buffer operations compatible with the memory type corresponding to the type A.

If the mode signal Smd designates the memory type corresponding to the type B, then the switches 41, 42, 43, 53, 54, 55 and 56 each select the terminal "b" and so does the power supply switch 57. In this case, the buffer power supply line 74 serves as the 2.5 V power supply line, supplying the voltage of 2.5 V to the type B buffers 48, 49 and 50, as well as to the type B tri-state buffer 51. In the I/O buffer 22, the type B buffers 48, 49 and 50 and the type B tri-state buffer 51 then operate to input and output various signals, thereby implementing the input/output buffer operations compatible with the memory type corresponding to the type B.

Figure 12:
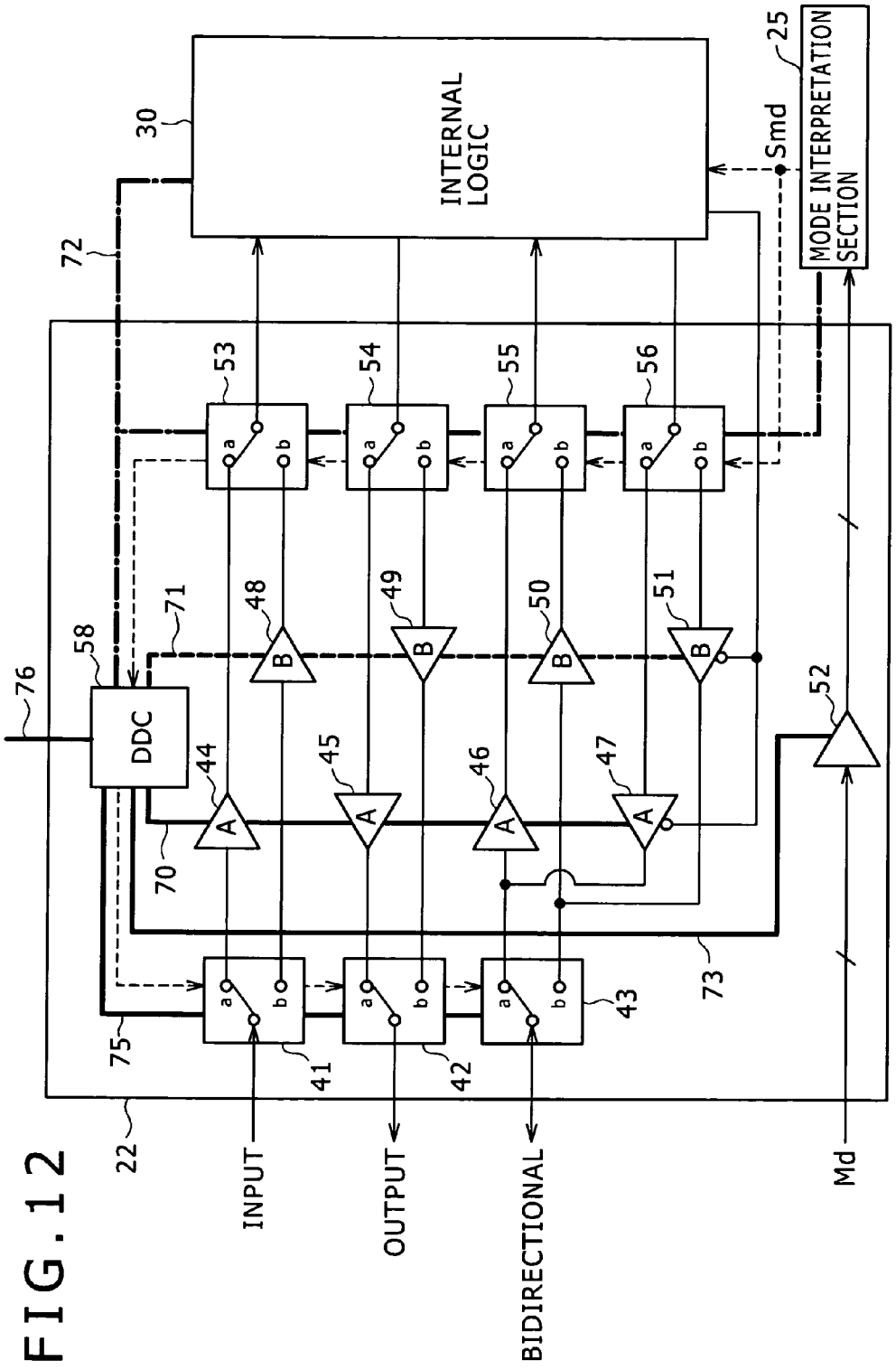
FIG. 12 is a further explanatory schematic view of the mode operations in effect when the input/output buffer of the embodiment is active.

A further typical structure of the I/O buffer 22 now will be described by referring to FIG. 12. The structure of FIG. 12 has a common power supply line 76 as the sole power supply line introduced into the semiconductor memory device 1 from the outside. A DC/DC converter 58 is included in the I/O buffer 22.

The DC/DC converter 58 converts the supply voltage on the common power supply line 76 into voltage levels necessary for supplying voltages to various internal power supply lines. Specifically, the DC/DC converter 58 powers the switches 41, 42 and 43 by using a switch power supply line 75.

The DC/DC converter 58 then supplies the voltage of 3.3 V to the type A buffers 44, 45 and 46, as well as to the type A tri-state buffer 47, by use of the type A buffer power supply line 70.

The DC/DC converter 58 further supplies the voltage of 2.5 V to the type B buffers 48, 49 and 50, as well as to the type B tri-state buffer 51, through the use of the type B buffer power supply line 71.

Moreover, the DC/DC converter 58 uses the mode buffer power supply line 73 to power the buffer amplifier 52. The DC/DC converter 58 also supplies a predetermined voltage to the internal logic 30, the switches 53, 54, 55 and 56, and the mode interpretation section 25 by use of the internal logic power supply line 72.

The mode signal Smd from the mode interpretation section 25 is sent to the switches 41, 42, 43, 53, 54, 55 and 56, as well as to the DC/DC converter 58. In keeping with the mode signal Smd, the DC/DC converter 58 selectively outputs the appropriate voltage to the type A buffer power supply line 70 or to the type B buffer power supply line 71.

For example, if the mode signal Smd designates the memory type corresponding to the type A, then the switches 41, 42, 43, 53, 54, 55 and 56 each select the terminal "a". Given the mode signal Smd, the DC/DC converter 58 supplies the voltage of 3.3 V to the type A buffer power supply line 70 while powering the switch power supply line 75, the mode buffer power supply line 73, and the internal logic power supply line 72 for operation purposes.

In the I/O buffer 22, the type A buffers 44, 45 and 46 and the type A tri-state buffer 47 then operate to input and output various signals. This makes it possible to implement the input/output buffer operations compatible with the memory type corresponding to the type A.

If the mode signal Smd designates the memory type corresponding to the type B, then the switches 41, 42, 43, 53, 54, 55 and 56 each select the terminal "b". Given the mode signal Smd, the DC/DC converter 58 supplies the voltage of 2.5 V to the type B buffer power supply line 71 while powering the switch power supply line 75, the mode buffer power supply line 73, and the internal logic power supply line 72 for operation purposes.

In the I/O buffer 22, the type B buffers 48, 49 and 50 and the type B tri-state buffer 51 then operate to input and output various signals. This makes it possible to implement the input/output buffer operations compatible with the memory type corresponding to the type B.

Figure 13:
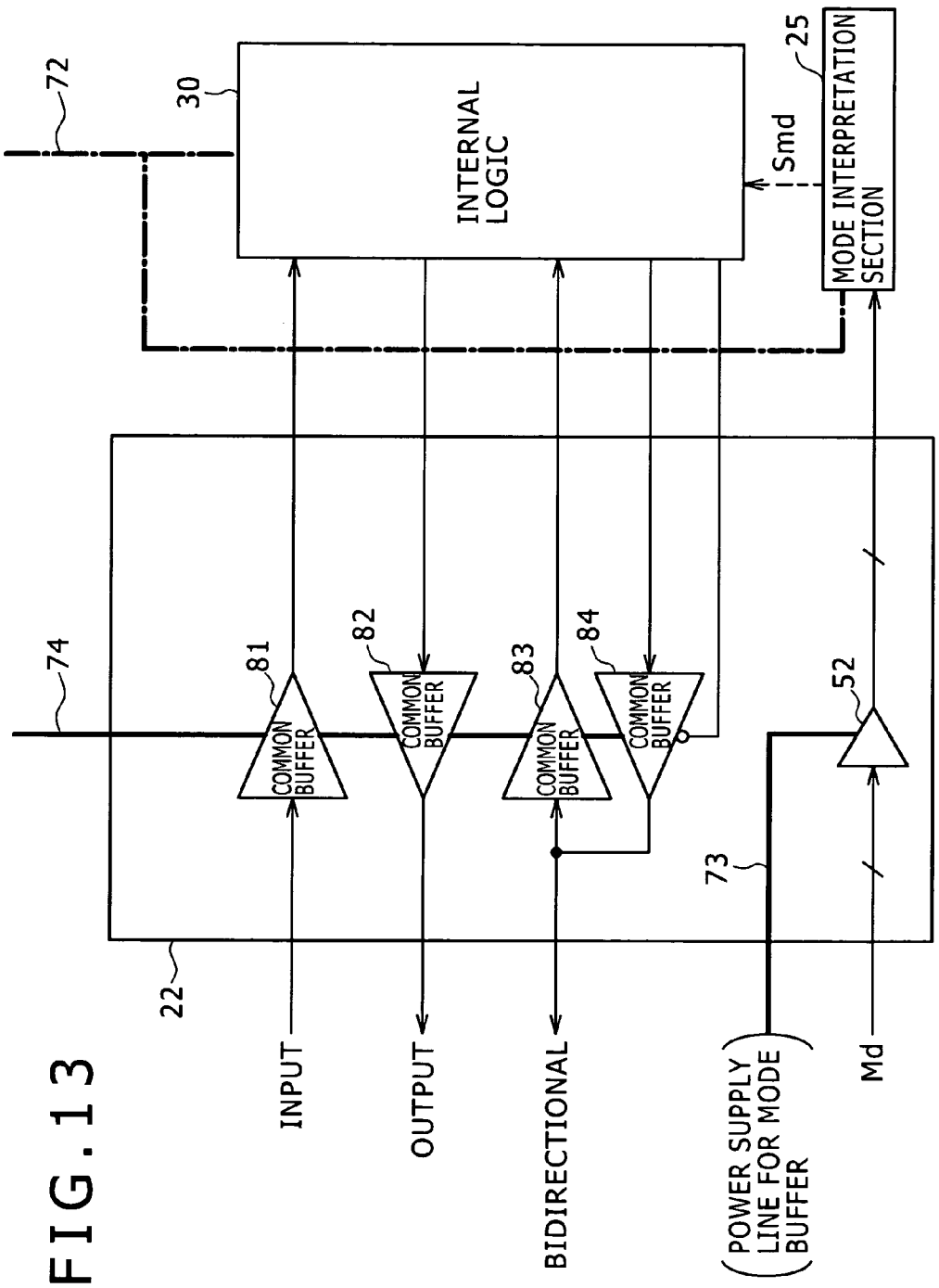
FIG. 13 is an even further explanatory schematic view of the mode operations in effect when the input/output buffer of the embodiment is active.

An even further typical structure of the I/O buffer 22 now will be described by referring to FIG. 13. In the structure of FIG. 13, the I/O buffer 22 is not subject to any internal changeover based on the mode signal Smd.

The I/O buffer 22 includes a common buffer 81 as part of the input stream, a common buffer 82 as part of the output stream, and a common buffer 83 as well as a common tri-state buffer 84 as part of the bidirectional stream. The common buffers 81, 82 and 83, as well as the common tri-state buffer 84, are each a buffer amplifier that accommodates the voltage range and delays of the applied voltage.

There are three power supply lines, i.e., a buffer power supply line 74, a mode buffer power supply line 73, and an internal logic power supply line 72, that are introduced into the semiconductor memory device 1 from the outside. The buffer power supply line 74 powers the common buffers 81, 82 and 83, as well as the common tri-state buffer 84. The internal logic power supply line 72 powers the relevant components in the internal logic 30 and the mode interpretation section 25. The mode buffer power supply line 73 powers the buffer amplifier 52.

The buffer power supply line 74 is fed with a predetermined supply voltage depending on the type of memory that the semiconductor memory device 1 is arranged to constitute when mounted on a circuit board of the host electronic apparatus. For example, if the electronic apparatus utilizes the semiconductor memory device 1 as the SDR, then the buffer power supply line 74 is connected fixedly to a 3.3 V power supply line through circuit board wiring. If the electronic apparatus employs the semiconductor memory device 1 as the DDR, then the buffer power supply line 74 is connected fixedly to a 2.5 V power supply line through circuit board wiring.

In this setup, the I/O buffer 22 does not need to execute any changeover based on the mode signal Smd from the mode interpretation section 25. The changeover according to the mode signal Smd is performed by the selector 23 and PLL section 24 in the internal logic 30.

For example, if the semiconductor memory device 1 is handled as the SDR, then the buffer power supply line 74 serves to provide the voltage of 3.3 V that allows the common buffers 81, 82 and 83 as well as the common tri-state buffer 84 to operate. If the semiconductor memory device is utilized as the DDR, then the buffer power supply line 74 serves to provide the voltage of 2.5V that enables the common buffer 81, 82 and 83, as well as the common tri-state buffer 84, to function.

Figure 14:
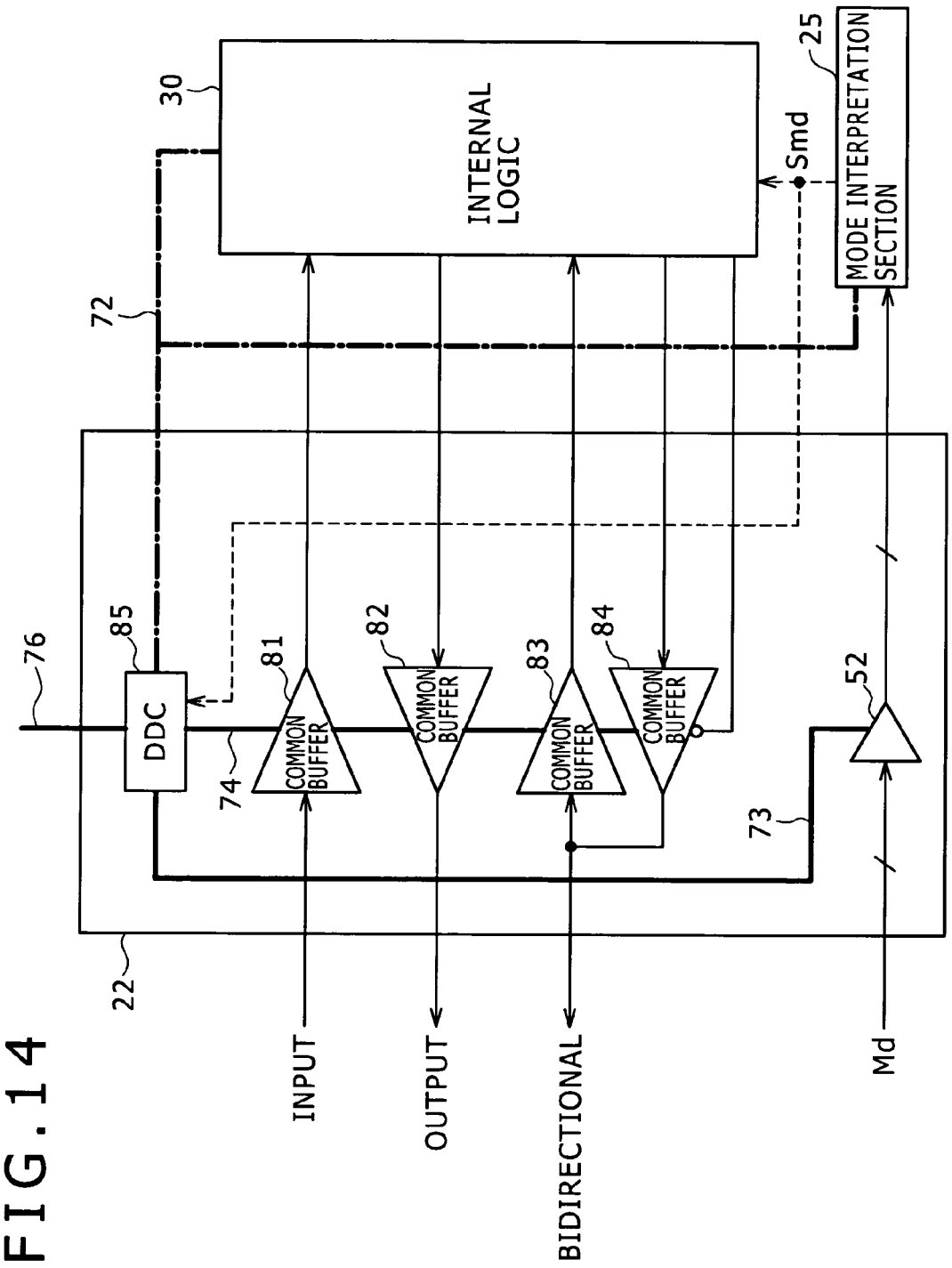
FIG. 14 is a still further explanatory schematic view of the mode operations in effect when the input/output buffer of the embodiment is active.

A still further typical structure of the I/O buffer 22 now will be described by referring to FIG. 14. As with the structure in FIG. 13, this structure includes the common buffers 81, 82 and 83, as well as the common tri-state buffer 84. The common power supply line 76 is furnished as the power supply line introduced into the common memory device 1 from the outside. A DC/DC converter 85 is included in the I/O buffer 22.

The DC/DC converter 58 converts the supply voltage on the common power supply line 76 into voltage levels necessary for supplying voltages to various internal power supply lines. Specifically, the DC/DC converter 58 powers the common buffers 81, 82 and 83, as well as the common tri-state buffer 84, by using the buffer power supply line 74.

The DC/DC converter 85 also powers the buffer amplifier 52 by use of the mode buffer power supply line 73. The DC/DC converter 85 further supplies the voltage to the internal logic 30 and to the mode interpretation section 25 through the use of the internal logic power supply line 72.

In the I/O buffer 22, the mode signal Smd from the mode interpretation section 25 is sent to the DC/DC converter 85. In accordance with the mode signal Smd, the DC/DC converter 85 changes the voltage supplied to the buffer power supply line 74.

For example, if the mode signal Smd designates the SDR mode, then the DC/DC converter 85 supplies the voltage of 3.3 V to the buffer power supply line 74 while powering the mode buffer power supply line 73 and the internal logic power supply line 72 for operation purposes. In the I/O buffer 22, the common buffers 81, 82 and 83 and the common tri-state buffer 84 then operate to carry out input/output buffer operations compatible with the SDR.

If the mode signal Smd designates the DDR mode, then the DC/DC converter 85 supplies the voltage of 2.5 V to the buffer power supply line 74 while powering the mode buffer power supply line 73 and the internal logic power supply line 72 for operation purposes. In the I/O buffer 22, the common buffers 81, 82 and 83 and the common tri-state buffer 84 then operate to carry out input/output buffer operations compatible with the DDR.

When the I/O buffer 22 is implemented using the structures that have been described above with reference to FIGS. 10 through 14, it is possible to carry out the input/output buffer operations compatible with diverse modes (i.e., memory types) that may be adopted.

6. Other Embodiments of the Semiconductor Memory Device

The semiconductor memory device practiced as one embodiment of the present invention is shown structurally outlined in FIG. 2. However, this does not limit the invention, and many other embodiments of it are conceivable.

Figure 15:
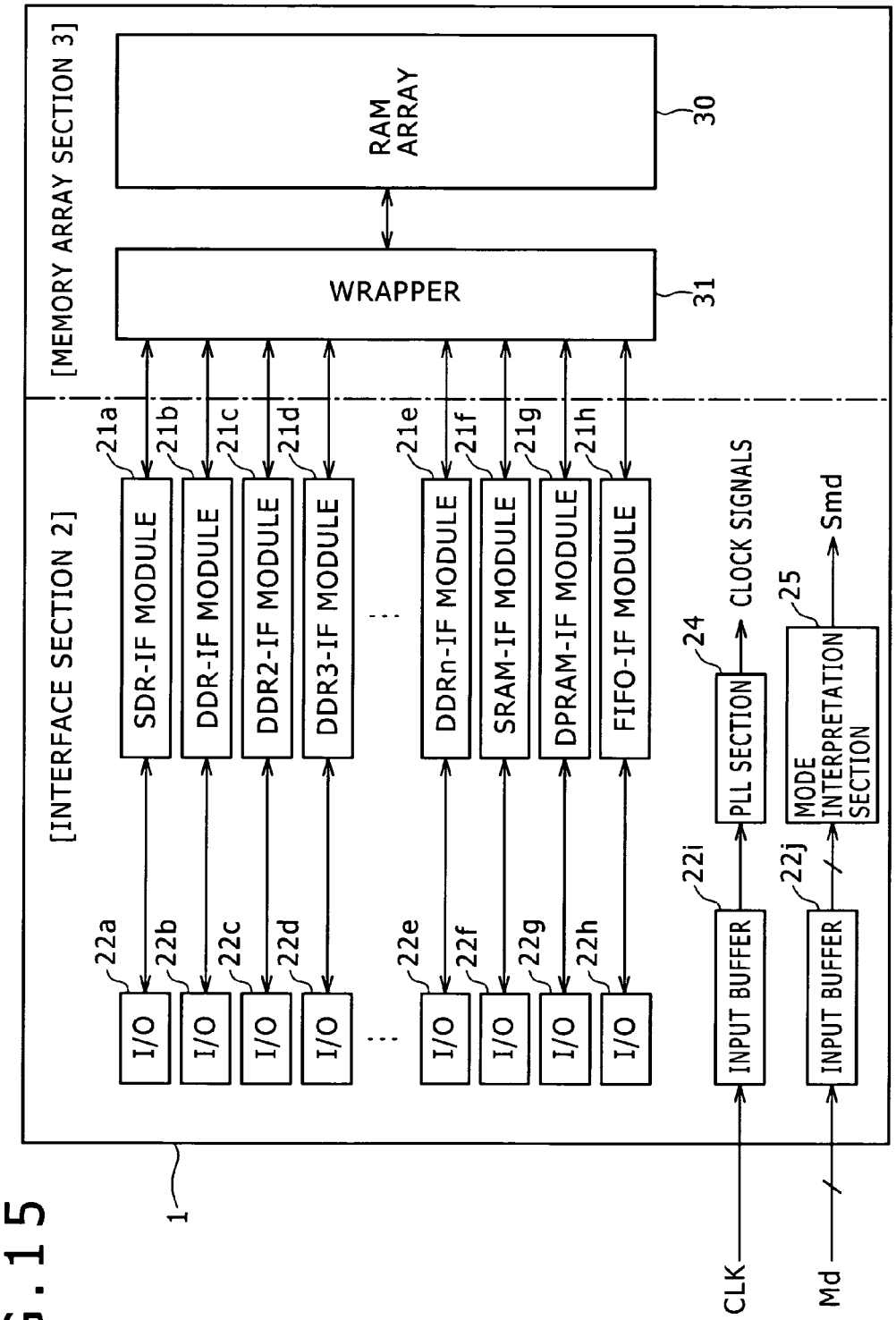
FIG. 15 is a block diagram of a semiconductor memory device practiced as a second embodiment of the present invention.

FIG. 15 gives a block diagram of a semiconductor memory device practiced as a second embodiment of the present invention. Of the reference characters found in FIG. 15, those already used in FIG. 2 designate like corresponding parts, and their descriptions will be omitted where redundant.

The structure shown in FIG. 15 is an example in which the interface modules 21a through 21h are each furnished with a dedicated I/O buffer. Specifically, the SDR-IF module 21a is provided with an I/O buffer 22a; the DDR-IF module 21b is provided with an I/O buffer 22b; the DDR2-IF module 21c is provided with an I/O buffer 22c; the DDR3-IF module 21d is provided with an I/O buffer 22d; the DDR(n)-IF module 21e is provided with an I/O buffer 22e; the SRAM-IF module 21f is provided with an I/O buffer 22f; the DPRAM-IF module 21g is provided with an I/O buffer 22g; and the FIFO-IF module 21h is provided with an I/O buffer 22h.

An input buffer 22i is furnished to deal with the system clock signal CLK. The system clock signal CLK is fed to the PLL section 24 by way of the input buffer 22i.

An input buffer 22j is provided to handle the mode designation signal Md. The mode designation signal Md is sent to the mode interpretation section 25 through the input buffer 22j.

In the above-outlined structure of the second embodiment, the I/O buffers 22a through 22h are arranged to have their own input/output signal streams, buffer amplifiers, and connection terminals applicable to the corresponding interface modules 21a through 21h.

For example, the I/O buffer 22a corresponding to the SDR-IF module 21a includes an input terminal and an input buffer for the command CMD, an input terminal and an input buffer for the data input DQin, and an output terminal and an output buffer for the data output DQout. Obviously, these buffers in the I/O buffer 22a have electrical characteristics compatible with the SDR.

The I/O buffer 22b corresponding to the DDR-IF module 21b includes an input terminal and an input buffer for the command CMD, an input terminal and an input buffer for the data input DQin, an output terminal and an output buffer for the data output DQout, and an input/output terminal and an input/output buffer for the data strobe signal DQS. Needless to say, these buffers in the I/O buffer 22b have electrical characteristics compatible with the DDR.

Figure 16:
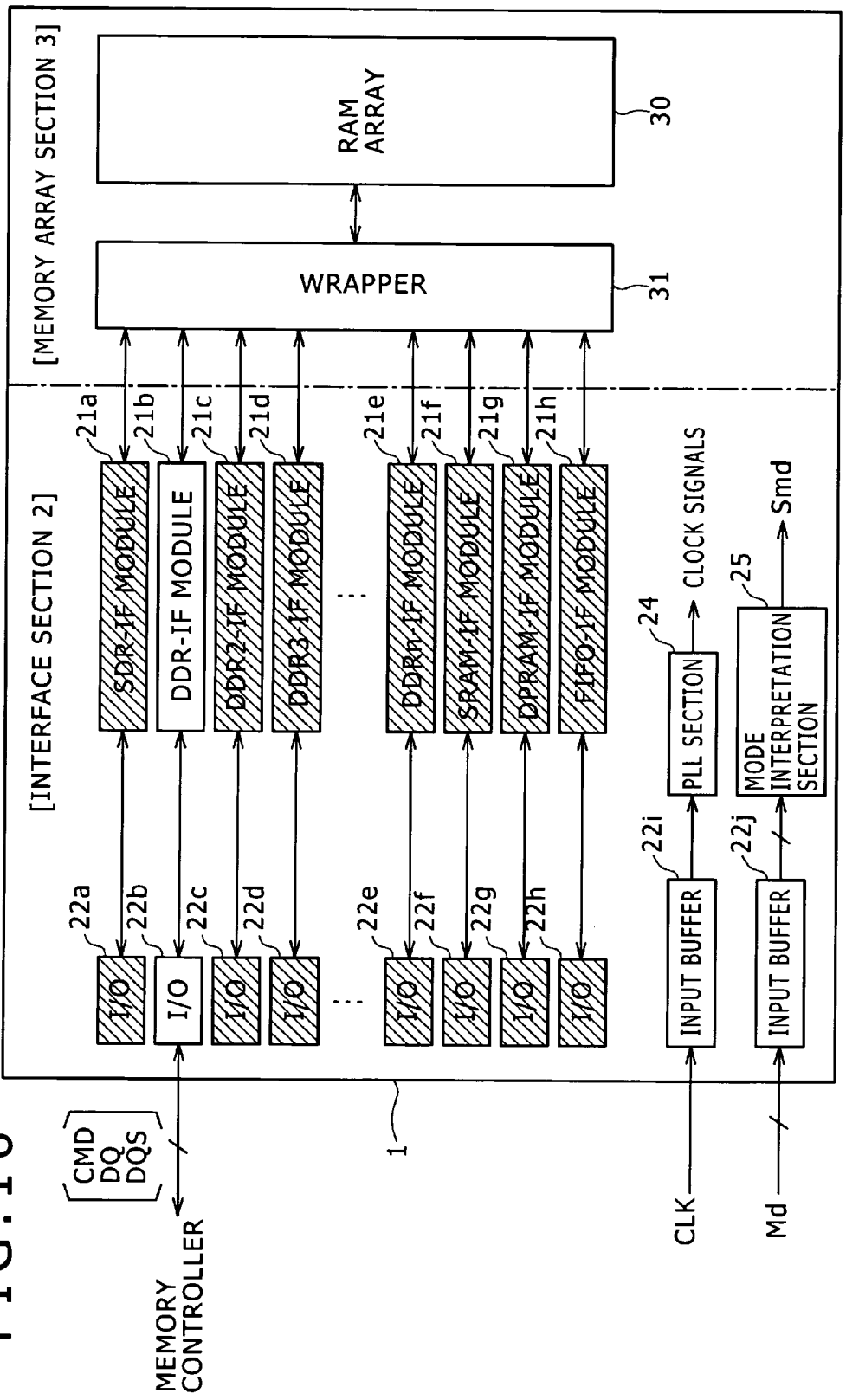
FIG. 16 is an explanatory schematic view of how the semiconductor memory device of the second embodiment operates.

In the above structure of the second embodiment, the I/O buffer that is to be connected with the memory controller 100 is selected from among the I/O buffers 22a through 22h depending on the type of memory the semiconductor memory device 1 is arranged to constitute when mounted on a circuit board of the host electronic apparatus. For example, if the electronic apparatus utilizes the semiconductor memory device 1 as the DDR, then the circuit board wiring is designed to have the terminals of the I/O buffer 22b connected to the memory controller. In that setup, as shown in FIG. 16, various signals are exchanged between the memory controller 100 and the DDR-IF module 21b through the I/O buffer 22b. In this case, the other I/O buffers 22a and 22c through 22h are not used.

Obviously, with the mode designation signal Md set to designate DDR mode, the mode interpretation section 25 supplies the PLL section 24 with the mode signal Smd denoting the DDR mode. In turn, the PLL section 24 feeds a group of clock signals to the DDR-IF module 21b for processing thereby, turning on the module. At the same time, the PLL section 24 stops sending clock signals to the other interface modules 21a and 21c through 21h to keep them inactive.

With the above settings in place, the semiconductor memory device 1 is arranged to function as the DDR. In this setup, the selector 23 shown in FIG. 2 becomes unnecessary.

Depending on the power supply arrangements of the I/O buffers 22a through 22h, the I/O buffer 22b is fed illustratively with the voltage of 2.5 V for buffer operation purposes through the use of the mode signal Smd. Alternatively, if a common power supply line is connected to the I/O buffers 22a through 22h, then the power supply line may be arranged to connect with the 2.5 V power supply line by the circuit board design.

Figure 17:
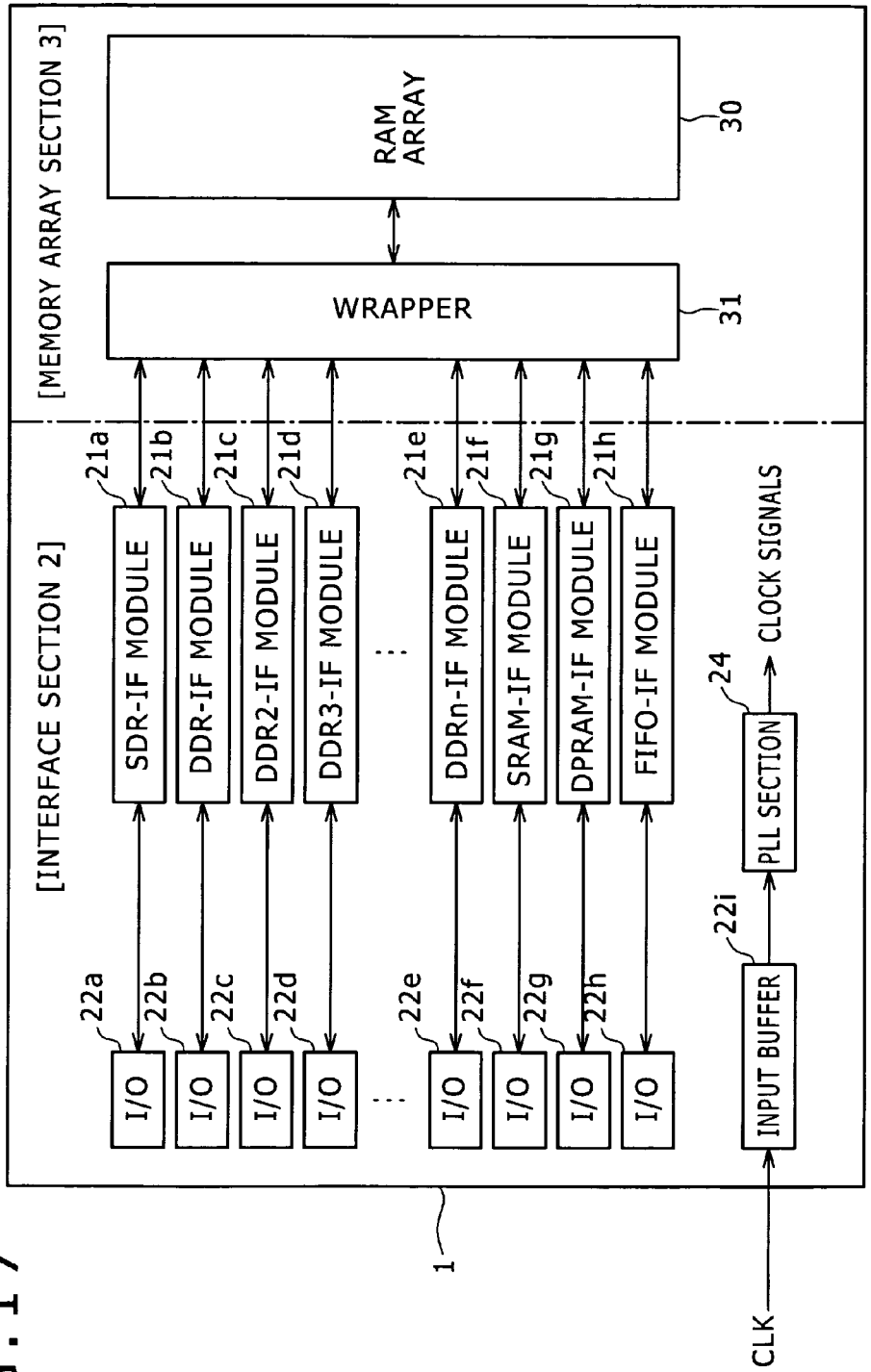
FIG. 17 is a block diagram of a semiconductor memory device practiced as a third embodiment of the present invention.

A third embodiment of the present invention is outlined structurally in FIG. 17. Of the reference characters found in FIG. 17, those already used in FIG. 15 designate like or corresponding parts. The structure in FIG. 17 is an example that has neither the input stream of the mode designation signal Md nor the mode interpretation section 25, thus eliminating the need for changeover control based on the mode signal Smd.

As in the structure of FIG. 15 discussed above, the I/O buffers 22a through 22h in the structure of FIG. 17 are furnished in a manner corresponding to the interface modules 21a through 21h respectively. The appropriate I/O buffer is selected thusly for connecting to the memory controller 100, depending on the type of memory the semiconductor memory device 1 is arranged to constitute.

The PLL section 24 does not switch the clock supply based on the mode signal Smd. All interface modules 21a through 21h just are supplied with necessary clock signals continuously.

The present invention has been described using specific embodiments of the semiconductor memory device 1. The inventive semiconductor memory device has been shown to improve the efficiency in designing and manufacturing electronic apparatuses that incorporate the memory device and to stabilize the manufacture of such apparatuses. For example, if the manufacturer of an electronic apparatus incorporating the memory of a certain memory type is faced with an unstable supply of the memory type currently in use, the manufacturer can replace the presently adopted memory with the semiconductor memory device 1 that can be arranged to operate in exactly the same manner as before. This makes it possible for the manufacturer to keep producing the electronic apparatus without altering the designs of the memory control circuit and peripheral circuits involved.

Where a new electronic apparatus is to be designed, the use of the semiconductor memory device 1 as the memory chip to be incorporated in the new apparatus promises higher degrees of flexibility and efficiency at the design stage than before. In addition, possible future modifications in the specifications of the memory can be addressed easily by the semiconductor memory device 1.

Although the description above contains many specificities, these should not be construed as limiting the scope of the invention but as merely providing illustrations of some of the presently preferred embodiments of this invention.

It is understood that changes and variations may be made without departing from the spirit or scope of the claims that follow. For example, a minimum of two interface modules 21 may be mounted. This allows the semiconductor memory device to function as one of at least two memory types.

It should be understood by those skilled in the art that various modifications, combinations, sub-combinations and alternations may occur depending on design requirements and other factors insofar as they are within the scope of the appended claims or the equivalent thereof.

What is claimed is:

1. A semiconductor memory device comprising:
a memory array section having memory devices, a random access memory category for one of the memory devices being diverse from a random access memory category for another of the memory devices;
an interface section having interface modules, said interface modules being configured to transfer data between an external memory controller and said memory devices,
wherein one of the interface modules is connectable to only one of the memory devices, another of the interface modules being connectable to only another of the memory devices.

2. The semiconductor memory device according to claim 1, wherein said interface section includes an input/output buffer section, said input/output buffer section being configured to input and output signals to and from said external memory controller.

3. The semiconductor memory device according to claim 2, wherein said signals are exchanged between said external memory controller and said memory array section.

4. The semiconductor memory device according to claim 1, wherein each of the interface modules is connectable to said external memory controller.

5. The semiconductor memory device according to claim 1, wherein said random access memory category for said one of the memory devices is diverse from a random access memory category for a different one of the memory devices.

6. The semiconductor memory device according to claim 5, wherein said random access memory category for said another of the memory devices is diverse from said random access memory category for said different one of the memory devices.

7. The semiconductor memory device according to claim 1, wherein said interface section is sealed in a package.

8. The semiconductor memory device according to claim 1, wherein said memory array section is on a silicon die.

9. The semiconductor memory device according to claim 8, wherein said interface section is on said silicon die.

10. The semiconductor memory device according to claim 8, wherein said interface section is on another silicon die.

11. The semiconductor memory device according to claim 1, wherein said one of the interface modules is connected to said one of the memory devices, said another of the interface modules being unconnected to said another of the memory devices.

12. The semiconductor memory device according to claim 11, wherein a selector connects said one of the interface modules to said one of the memory devices.

13. The semiconductor memory device according to claim 1, wherein said memory array section stores said data.

14. A method for operating the semiconductor memory device of claim 1, the method comprising the steps of:
selecting a memory device from the memory devices, the memory device selected complying with specifications of the external memory controller being connected;
selecting an interface module from the interface modules, the interface module selected accessing said memory array section for either a write or a read operation in response to either a write or a read request issued by said external memory controller.

* * * * *